United States Patent
Choi et al.

(10) Patent No.: US 12,433,100 B2
(45) Date of Patent: Sep. 30, 2025

(54) DISPLAY DEVICE HAVING CRACK PREVENTION PORTIONS ON A SIDE PORTION AND METHOD OF FABRICATING THE SAME

(71) Applicant: SAMSUNG DISPLAY CO., LTD., Yongin-si (KR)

(72) Inventors: Jun Won Choi, Seoul (KR); Jae Won Kim, Cheongju-si (KR); Jun Young Min, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/383,265

(22) Filed: Oct. 24, 2023

(65) Prior Publication Data

US 2024/0057385 A1 Feb. 15, 2024

Related U.S. Application Data

(62) Division of application No. 17/178,414, filed on Feb. 18, 2021, now Pat. No. 11,839,111.

(30) Foreign Application Priority Data

Jun. 22, 2020 (KR) .................. 10-2020-0075492

(51) Int. Cl.
*H10K 59/121* (2023.01)
*H10K 50/844* (2023.01)
(Continued)

(52) U.S. Cl.
CPC ......... *H10K 59/121* (2023.02); *H10K 50/844* (2023.02); *H10K 59/1213* (2023.02);
(Continued)

(58) Field of Classification Search
CPC .............. H01L 27/326; H01L 27/3262; H01L 27/3276; H01L 51/5253; H01L 51/56; H10K 50/844; H10K 59/12; H10K 59/1213; H10K 59/131; H10K 71/00; H10K 71/40; H10K 71/421; H10K 71/441
(Continued)

(56) References Cited

U.S. PATENT DOCUMENTS 9,525,012 B2 12/2016 Lim et al.
9,978,825 B2 5/2018 Lim et al.
(Continued)

FOREIGN PATENT DOCUMENTS

KR 10-2015-006554 6/2015
KR 10-2018-0036432 4/2018
(Continued)

*Primary Examiner* — Matthew E. Gordon
(74) *Attorney, Agent, or Firm* — F. CHAU & ASSOCIATES, LLC

(57) ABSTRACT

A display device includes a display panel having a front portion and at least one side portion that is bent from at least one side of the front portion. The front portion includes first pixels. The side portion includes second pixels and crack prevention portions that are disposed adjacent to the second pixels. A number of the first pixels per unit area disposed in the front portion is greater than a number of the second pixels per unit area disposed in the at least one side portion.

6 Claims, 23 Drawing Sheets

(51) Int. Cl.
*H10K 59/131* (2023.01)
*H10K 59/80* (2023.01)
*H10K 71/00* (2023.01)

(52) U.S. Cl.
CPC ....... *H10K 59/131* (2023.02); *H10K 59/8731* (2023.02); *H10K 71/00* (2023.02)

(58) Field of Classification Search
USPC .......................................... 257/40
See application file for complete search history.

(56) References Cited

U.S. PATENT DOCUMENTS

| | | | |
|---|---|---|---|
| 10,381,427 | B2 | 8/2019 | Lim et al. |
| 10,868,096 | B2 | 12/2020 | Park et al. |
| 2014/0320543 | A1* | 10/2014 | Oh ........................ H10K 59/121 |
| | | | 345/82 |
| 2014/0361262 | A1* | 12/2014 | Kim ........................ G09G 3/035 |
| | | | 257/40 |
| 2015/0162392 | A1* | 6/2015 | Lim .................... H10K 59/1213 |
| | | | 257/72 |
| 2019/0013486 | A1* | 1/2019 | Li ........................ H10K 59/131 |
| 2019/0074331 | A1* | 3/2019 | Oh .................... H10K 59/80515 |
| 2021/0091320 | A1 | 3/2021 | Choi et al. |
| 2021/0327982 | A1* | 10/2021 | Zhou .................. H10K 50/8428 |
| 2021/0399071 | A1 | 12/2021 | Choi et al. |

FOREIGN PATENT DOCUMENTS

| | | |
|---|---|---|
| KR | 10-2018-0060861 | 6/2018 |
| KR | 10-2019-0040850 | 4/2019 |
| KR | 10-2019-0104091 | 9/2019 |
| KR | 10-2021-0035959 | 4/2021 |

* cited by examiner

DISPLAY DEVICE HAVING CRACK PREVENTION PORTIONS ON A SIDE PORTION AND METHOD OF FABRICATING THE SAME

CROSS-REFERENCE TO RELATED APPLICATIONS

This application is a divisional application of U.S. patent application Ser. No. 17/178,414 filed on Feb. 18, 2021, which claims priority tinder 35 U.S.C. § 119 to Korean Patent Application No. 10-2020-0075492, filed on Jun. 22, 2020 in the Korean Intellectual Property Office, the disclosures of which are incorporated by reference in their entireties herein.

1. TECHNICAL FIELD

Exemplary embodiments of the present inventive concepts relate to a display device and a method of fabricating the same.

2. DISCUSSION OF THE RELATED ART

The demand for display devices that display images has diversified as the information society has developed. For example, display devices have been applied to various electronic devices such as smart phones, digital cameras, notebook computers, navigation systems, and smart televisions (TVs).

Flat panel display devices have been developed such as a liquid crystal display (LCD) device, a field emission display (FED) device, an organic light-emitting diode (OLED) display device, and the like. OLED display devices provide desirable features such as wide viewing angles, excellent contrast ratios, and fast response speeds. Since OLED display devices can be implemented as flexible display devices that are bendable or foldable, the application of OLED display devices to electronic devices has increased. For example, display devices that display images on their side portions and are curved from their front portions have been developed.

However, as the angle between the side portions of an OLED display device with the front portion of the OLED display device increases, the inorganic films of the OLED display device become increasingly likely to crack in the side portions. If cracks are generated in the inorganic films in the side portions, the organic light-emitting layer of the OLD display device may not be sufficiently encapsulated and may be oxidized. As a result, some of the pixels in the side portions may not be able to emit light.

SUMMARY

Exemplary embodiments of the present inventive concepts include a display device that prevents the propagation of any cracks in inorganic films in the side portions thereof and a method of fabricating the display device.

According to an exemplary embodiment of the present inventive concepts, a display device includes a display panel having a front portion and at least one side portion that is bent from at least one side of the front portion. The front portion includes first pixels. The side portion includes second pixels and crack prevention portions that are disposed adjacent to the second pixels. A number of the first pixels per unit area disposed in the front portion is greater than a number of the second pixels per unit area disposed in the at least one side portion.

In an exemplary embodiment, N second pixels (where N is a positive integer) may be disposed between each pair of adjacent crack prevention portions in a first direction.

In an exemplary embodiment, N second pixels (where N is a positive integer) may be disposed between each pair of adjacent crack prevention portions in a second direction that intersects the first direction.

In an exemplary embodiment, a size of the crack prevention portions may be smaller than a size of N second pixels combined.

In an exemplary embodiment, the crack prevention portions may be arranged in a zigzag fashion.

In an exemplary embodiment, each of the crack prevention portions may be surrounded by the second pixels.

In an exemplary embodiment, the crack prevention portions may extend in one direction.

In an exemplary embodiment, the second pixels may be arranged in the one direction.

In an exemplary embodiment, the first pixels and the second pixels each may include first, second, third, and fourth emission areas, and shapes of the first, second, third, and fourth emission areas of each of the first pixels may be different from shapes of the first, second, third, and fourth emission areas of each of the second pixels.

In an exemplary embodiment, P second pixels (where P is a positive integer) may be surrounded by the crack prevention portions.

In an exemplary embodiment, scan lines or data lines may be disposed between the second pixels and the crack prevention portions.

In an exemplary embodiment, each of the second pixels may include an active layer of a thin-film transistor, which is disposed on a buffer film of a substrate, a first insulating film, which is disposed on the active layer, a gate electrode of the thin-film transistor, which is disposed on the first insulating film, a second insulating film, which is disposed on the gate electrode, first and second electrodes of the thin-film transistor, which are disposed on the second insulating film, and a first organic film, which is disposed on the first and second electrodes.

In an exemplary embodiment, the crack prevention portions may include holes, which expose the substrate through the buffer film and the second insulating film.

In an exemplary embodiment, the holes of the crack prevention portions may be filled with the first organic film.

According to an exemplary embodiment of the present inventive concepts, a display device includes a display panel including a front portion and at least one side portion that is bent from at least one side of the front portion. The front portion includes first pixels. The at least one side portion includes second pixels and crack prevention portions that are disposed adjacent to the second pixels. A size of each of the first pixels is greater than a size of each of the second pixels.

In an exemplary embodiment, a number of first pixels per unit area of the front portion is greater than a number of second pixels per unit area of the side portion.

In an exemplary embodiment, the first pixels and the second pixels each include first, second, third, and fourth emission areas, and shapes of the first, second, third, and fourth emission areas of each of the first pixels are different from shapes of the first, second, third, and fourth emission areas of each of the second pixels.

In an exemplary embodiment, the first pixels and the second pixels each include first, second, third, and fourth emission areas, and sizes of the first, second, third, and fourth emission areas of each of the first pixels are different from sizes of the first, second, third, and fourth emission areas of each of the second pixels.

According to an exemplary embodiment of the present inventive concepts, a method of fabricating a display device includes forming thin-film transistors and a plurality of inorganic insulating films on a substrate. Holes that expose the substrate are formed through the plurality of inorganic insulating films. A first organic film is formed on the thin-film transistors and the plurality of inorganic insulating films. An anode electrode, an organic light-emitting layer, and a cathode electrode of each of light-emitting elements are formed on the first organic film.

In an exemplary embodiment, the holes may be filled with the first organic film.

BRIEF DESCRIPTION OF THE DRAWINGS

The above and other features of the present inventive concepts will become more apparent by describing in detail exemplary embodiments thereof with reference to the accompanying drawings, in which.

DETAILED DESCRIPTION OF EXEMPLARY EMBODIMENTS

Figure 1:
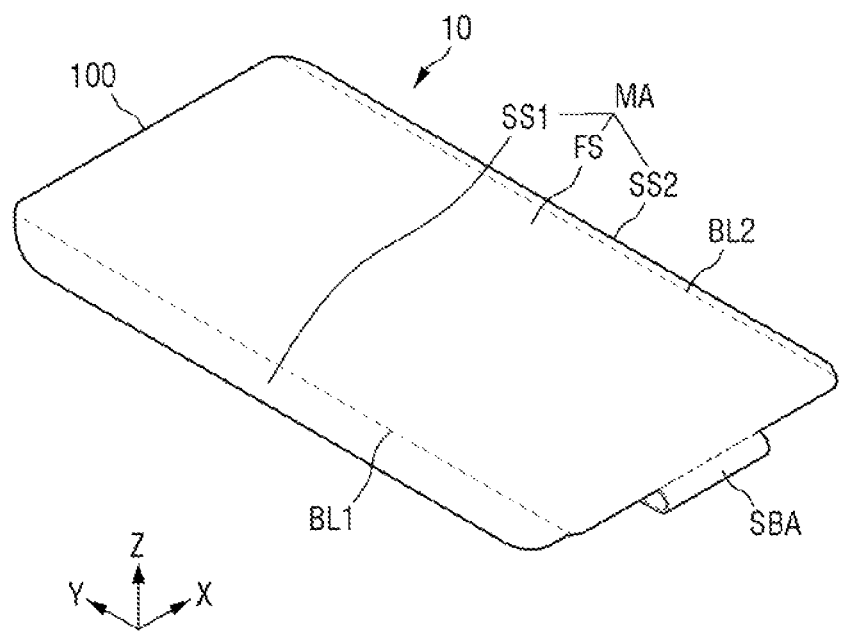
FIG. 1 is a perspective view of a display device according to an exemplary embodiment of the present inventive concepts.

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, the component can be directly on, connected, coupled, or adjacent to the other component, or intervening components may be present. It will also be understood that when a component is referred to as being "between" two components, the component can be the only component between the two components, or one or more intervening components may also be present. It will also be understood that when a component is referred to as "covering" another component, the component can be the only component covering the other component, or one or more intervening components may also be covering the other component. Other words use to describe the relationship between elements may be interpreted in a like fashion.

It will be further understood that descriptions of features or aspects within each exemplary embodiment are available for other similar features or aspects in other exemplary embodiments, unless the context clearly indicates otherwise.

As used herein, the singular forms "a". "an" and "the" are intended to include the plural forms as well, unless the context clearly indicates otherwise.

Spatially relative terms, such as "beneath", "below", "lower", "under", "above", "upper", etc., may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when one value is described as being about the same as or about equal to another value, it is to be understood that the values may be substantially equal to each other to within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

Figure 2:
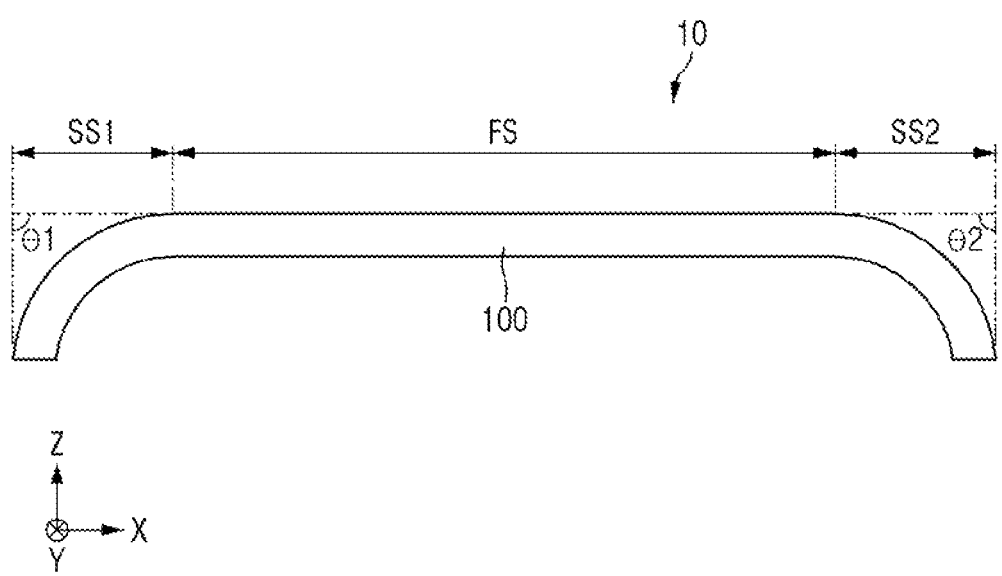
FIG. 2 is a side view of the display device of FIG. 1 according to an exemplary embodiment of the present inventive concepts.

FIG. 1 is a perspective view of a display device 10 according to an exemplary embodiment of the present inventive concepts. FIG. 2 is a side view of the display device 10 of FIG. 1. For convenience of illustration, a sub-area SBA of FIG. 1 is not illustrated in FIG. 2.

A display device 10 may be applied to a portable electronic device such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). In some exemplary embodiments, the display device 10 may be applied as the display unit of a television (TV), a notebook computer, a monitor, a billboard, or an Internet-of-Things (IoT) device. In some exemplary embodiments, the display device 10 may be applied to a wearable device such as a smartwatch, a watchphone, a glasses display, or a head-mounted display (HMD). Also, the display device 10 may be applied to the dashboard, the center fascia, or the center information display (CID) of a vehicle, the room mirror display of a vehicle that may replace side-view mirrors, or an entertainment display disposed at the rear of the front seat of a vehicle. However, exemplary embodiments of the present inventive concepts are not limited thereto and the display device 10 may be applied to other small, medium or large sized electronic devices in other exemplary embodiments.

Referring to the exemplary embodiments of FIGS. 1 and 2, the display device 10 may include a display panel 100.

As shown in the exemplary embodiment of FIG. 1, the display device 10 may be generally rectangular shaped. However, exemplary embodiments of the present inventive concepts are not limited thereto. In the description that follows, a first direction extending parallel to an X-axis (hereinafter, the "X direction") may refer to the direction of the relatively shorter sides of the display device 10, for example, a horizontal direction of the display device 10, a second direction extending parallel to a Y-axis (hereinafter, the "Y direction") may refer to the direction of the relatively longer sides of the display device 10, for example, a vertical direction of the display device 10, and a third direction extending parallel to a Z-axis (hereinafter, the "Z direction") may be a thickness direction of the display device 10.

The display panel 100 may be a light-emitting display panel including light-emitting elements. For example, the display panel 100 may be an organic light-emitting diode (OLED)) display panel using OLEDs that include organic light-emitting layers, a micro-light-emitting diode (micro-LED) display panel using micro-LEDs, a quantum-dot light-emitting diode (QLED) display panel using QLEDs that include quantum-dot light-emitting layers, or an inorganic electroluminescent (EL) display panel using inorganic light-emitting elements that include an inorganic semiconductor. However, exemplary embodiments of the present inventive concepts are not limited thereto. The display panel 100 will hereinafter be described as being, for example, an OLED display panel for convenience of explanation.

The display panel 100 may include a main area MA and a sub-area SBA. The main area MA may include a front portion FS, a first side portion SS1, and a second side portion SS2. While the display panel 100 in the exemplary embodiment of FIG. 1 includes two side portions, in other exemplary embodiments, the display panel 100 may include at least one side portion and the numbers of the side portions may vary.

The front portion FS may have a rectangular shape having relatively shorter sides in the X direction and relatively longer sides in the Y direction in a plan view (e.g., in a plane defined in the X and Y directions). However, exemplary embodiments of the present inventive concepts are not limited thereto. In another exemplary embodiment, the front portion FS may have another polygonal shape or a circular or elliptical shape in the plan view. The corners where the short sides and the long sides of the front portion FS meet may be rounded with a predetermined curvature or may be right-angled. The front portion FS may be flat or may include a curved surface.

The first side portion SS1 may extend from a first side of the front portion FS. For example, as shown in the exemplary embodiment of FIG. 1, the first side portion SS1 may extend from a first relatively longer side of the front portion FS extending in the Y direction, such as a left relatively longer side of the front portion FS. The first side portion SS1 may be bent along a first bending line BL1 disposed on the first side of the front portion FS and may have a first curvature. Due to the bend along the first bending line BL1, the first side portion SS1 may not extend in a plane in the X and Y directions. While the exemplary embodiments of FIGS. 1-2 show the first side of the front portion FS as the left side of the front portion FS, exemplary embodiments of the present inventive concepts are not limited thereto.

The second side portion SS2 may extend from a second side of the front portion FS. For example, as shown in the exemplary embodiment of FIG. 1, the second side portion SS2 may extend from a second relatively longer side of the front portion FS extending in the Y direction, such as a right relatively longer side of the front portion FS. The second side portion SS2 may be bent along a second bending line BL2 disposed on the second side of the front portion FS and may have a second curvature. The second curvature may be substantially the same as, or different from, the first curvature. Due to the bend along the second bending line BL2, the second side portion SS2 may not extend in a plane in the X and Y directions. While the exemplary embodiments of FIGS. 1 and 2 show the second side of the front portion FS as the right side of the front portion FS, exemplary embodiments of the present inventive concepts are not limited thereto.

The sub-area SBA may protrude from a third side of the front portion FS. Referring to the exemplary embodiment of FIG. 1, the third side of the front portion FS may be a relatively shorter side of the front portion FS that extends in the X direction and is arranged in the Y direction. For example, the third side of the front portion FS may be the lower side of the front portion FS (e.g., in the Y direction). However, exemplary embodiments of the present inventive concepts are not limited thereto. The length in the X direction of the sub-area SBA may be smaller than the length in the X direction of the third side of the front portion FS, and the length in the Y direction of the sub-area SBA may be smaller than the length in the Y direction of the first and second sides of the front portion FS. However, exemplary embodiments of the present inventive concepts are not limited thereto. The sub-area SBA may be bent and may be positioned below the front portion FS (e.g., in the Z direction). In this exemplary embodiment, the sub-area SBA may overlap with the front portion FS in the Z direction.

Referring to the exemplary embodiment of FIG. 2, a first angle θ1 that the first side portion SS1 is bent from the front portion FS may be about 90°, and a second angle θ2 at which the second side portion SS2 is bent from the front portion FS may be about 90°. For example, as shown in the exemplary embodiment of FIG. 2, the first and second side portions SS1, SS2 may have a curved surface that extends downwardly and the lowest portions (e.g., in the Z direction) of the first and second side portions SS1, SS2 which are disposed furthest from the front portion FS (e.g., in the X direction) may form the first and second angles θ1, θ2. However, the greater the angle θ1, the more likely inorganic films are to crack in the first side portion SS1. The greater the angle θ2, the more likely the inorganic films are to crack in the second side portion SS2.

In an exemplary embodiment in which the display panel 100 is an OLED display panel including OLEDs, the OLEDs may be exposed to oxygen due to the cracking of the inorganic film. For example, the OLEDs may be oxidized due to insufficient encapsulation and may thus remain as dark spots in the first and second side portions SS1 and SS2. Oxidized OLEDs may not be able to properly emit light. Accordingly, the propagation of any cracks in the inorganic film should be prevent to avoid the OLEDs from being exposed to oxygen.

Figure 3:
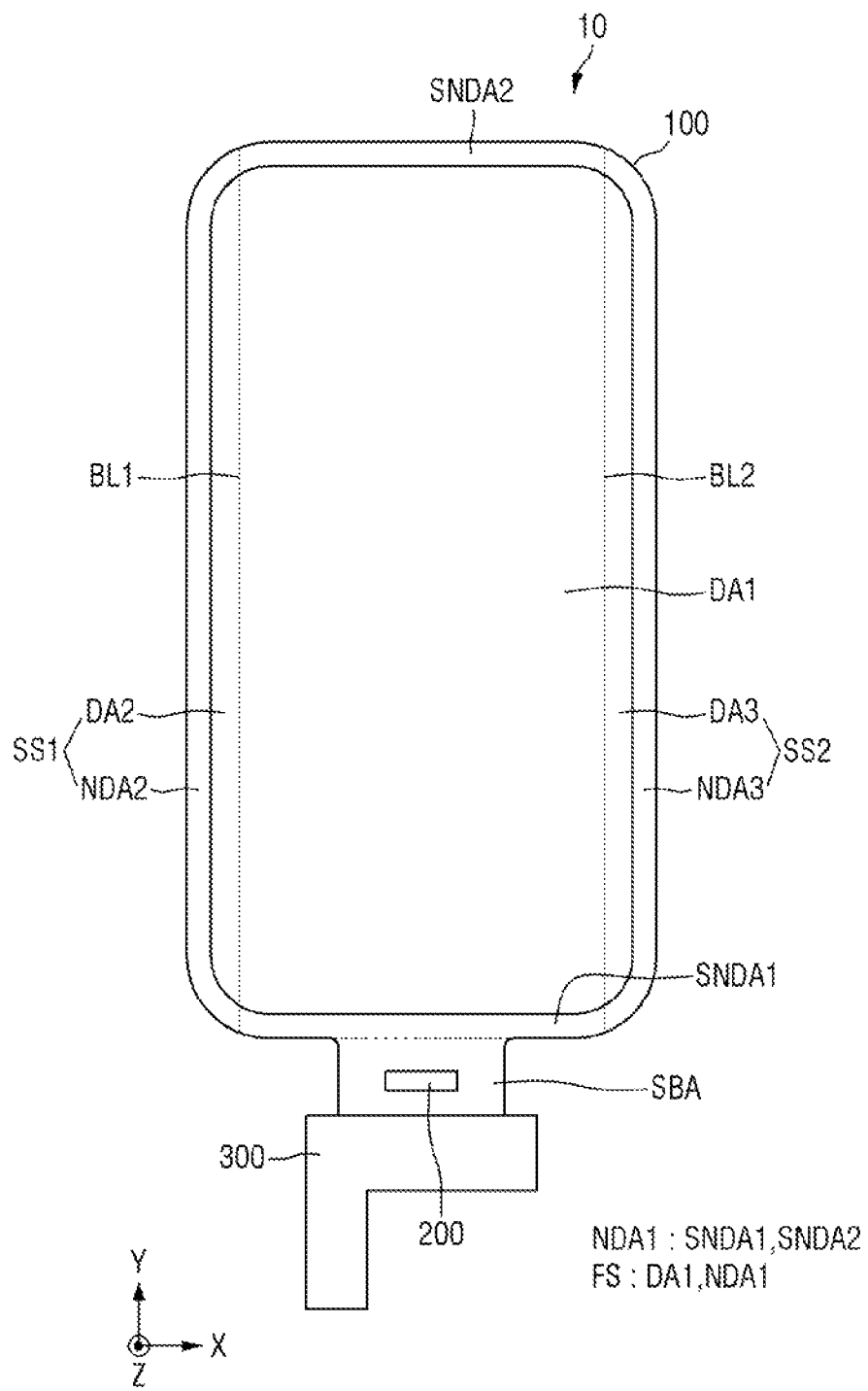
FIG. 3 is an exploded view of the display device of FIG. 1 according to an exemplary embodiment of the present inventive concepts.

FIG. 3 is an exploded view of the display device 10 of FIG. 1.

Referring to the exemplary embodiment of FIG. 3, the front portion FS of the display panel 100 may include a first display area DA1, which displays an image, and a first non-display area NDA1, which does not display an image. The first display area DA1 may extend across a majority of the front portion FS.

The first non-display area NDA1 may include first and second sub-non-display areas SNDA1 and SNDA2. As shown in the exemplary embodiment of FIG. 3, the first sub-non-display area SNDA1 may be disposed on the lower side of the first display area DA1 (e.g., in the Y direction), and the second sub-non-display area SNDA2 may be disposed on the upper side of the first display area DA1 (e.g., in the Y direction). The first sub-non-display area SNDA1 may be disposed along the lower edge of the display panel 100, and the second sub-non-display area SNDA2 may be disposed along the upper edge of the display panel 100. However, exemplary embodiments of the present inventive concepts are not limited thereto.

The first side portion SS1 may include a second display area DA2, which displays an image, and a second non-display area NDA2, which does not display an image. The second display area DA2 may be disposed on the left side of the first display area DA1, and the second non-display area NDA2 may be disposed on the left side of the second display area DA2. The second non-display area NDA2 may be disposed along the left edge of the display panel 100.

The second side portion SS2 may include a third display area DA3, which displays an image, and a third non-display area NDA3, which does not display an image. The third display area DA3 may be disposed on the right side of the first display area DA1, and the third non-display area NDA3 may be disposed on the right side of the third display area DA3.

The first and second display areas DA1 and DA2 may be divided by a first bending line BL1. For example, the first display area DA1 may be an area disposed on the right side of the first bending line BL1, and the second display area DA2 may be an area disposed on the left side of the first bending line BL1.

The first and third display areas DA1 and DA3 may be divided by a second bending line BL2. For example, the first display area DA1 may be an area disposed on the left side of the second bending line 1312, and the third display area DA3 may be an area disposed on the right side of the second bending line BL2.

The sub-area SBA may be disposed on the lower side of the first sub-non-display area SNDA1 of the front portion FS. A display driving circuit 200 and a display circuit board 300 may be disposed in the sub-area SBA.

The display driving circuit 200 may receive control signals and power supply voltages via the display circuit board 300 and may generate signals and voltages for driving the display panel 100. In an exemplary embodiment, the display driving circuit 200 may be attached on the sub-area SBA of the display panel 100 via chip-on-plastic (COP) or ultrasonic bonding. However, exemplary embodiments of the present inventive concepts are not limited thereto.

In an exemplary embodiment, the display circuit board 300 may be a flexible printed circuit board that is bendable, a rigid printed circuit board that is rigid and is not bendable, or a hybrid printed circuit board, which is a combination of a rigid printed circuit board and a flexible printed circuit board. In an exemplary embodiment, the display circuit board 300 may be attached onto pads in the sub-area SBA of the display panel 100 via a low-resistance, high-reliability material such as an anisotropic conductive film or a self-assembly anisotropic conductive paste (SAP).

As illustrated in the exemplary embodiment of FIG. 3, since the front portion FS, the first side portion SS1, and the second side portion SS2 of the display panel 100 include the first, second, and third display areas DA1, DA2, and DA3, respectively, a user can view an image not only from the front portion FS, but also from the first and second side portions SS1 and SS2, of the display panel 100. For example, the image is not only displayed on the first display area DA1 extending in a plane in the X and Y directions but is also displayed on the second and third display areas DA2, DA3 that are disposed on the angled first and second side portions SS1 and SS2, respectively.

Figure 4:
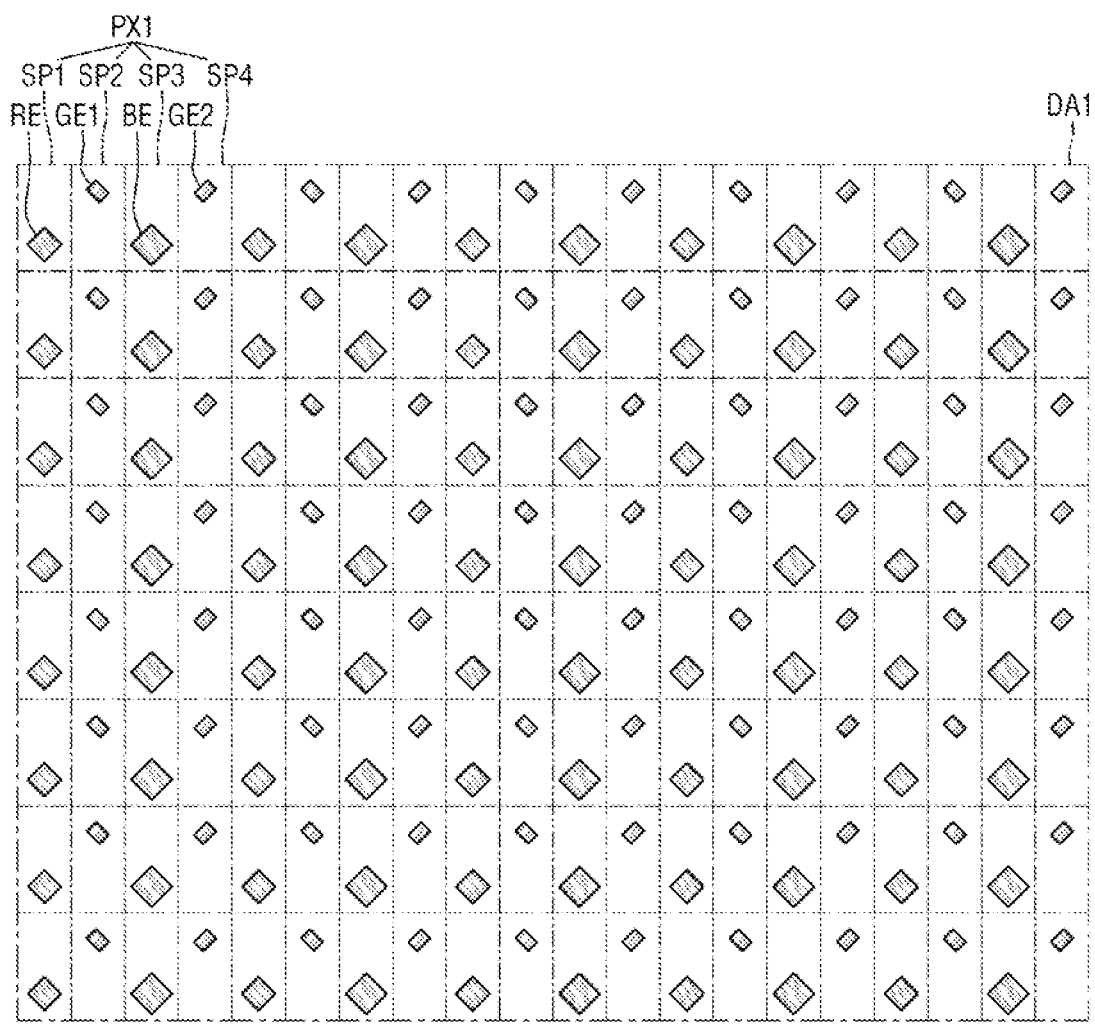
FIG. 4 is a layout view of a first display area of a front portion of a display panel according to an exemplary embodiment of the present inventive concepts.

FIG. 4 is a layout view of a first display area DA1 of a front portion FS of a display panel 100 according to an exemplary embodiment of the present inventive concepts.

Referring to the exemplary embodiment of FIG. 4, the first display area DA1 of the front portion FS may include first pixels PX1, which are for displaying an image. Each of the first pixels PX1 may include first, second, third, and fourth subpixels SP1, SP2, SP3, and SP34. The first, second, third, and fourth subpixels SP1, SP2, SP3, and SP4 may be arranged in the X direction.

The first subpixel SP1 may include a first emission are RE, which emits light of a first color. The second subpixel SP2 may include a second emission area GE1, which emits light of a second color. The third subpixel SP3 may include a third emission area BE, which emits light of a third color. The fourth subpixel SP4 may include a fourth emission area GE2, which emits light of a fourth color.

In an exemplary embodiment, the first, second, third, and fourth emission areas RE, GE1, BE, and GE2 may emit light of different colors. Alternatively, at least two of the first, second, third, and fourth emission areas RE, GE1, BE, and GE2 may emit light of the same color. For example, the second and fourth emission areas GE1 and GE2 may emit light of the same color.

In an exemplary embodiment, the first, second, third, and fourth emission areas RE, GE1, BE, and GE2 may have a tetragonal shape in a plan view. However, exemplary embodiments of the present inventive concepts are not limited thereto. Alternatively, the first, second, third, and fourth emission areas RE, GE1, BE, and GE2 may have a non-tetragonal polygonal shape, a circular shape, or an elliptical shape in the plan view. FIG. 4 illustrates that the third emission area BE is largest in size and the second and fourth emission areas GI and GE2 are smallest in size and have the same size. However, exemplary embodiments of the present inventive concepts are not limited thereto.

Second emmission areas GE1 and fourth emission areas GE2 may be alternately arranged in the X direction. The second emission areas GE1 may be arranged along the Y direction. The fourth emission areas GE2 may also be arranged along the Y direction. Each of the fourth emission areas GE2 may have relatively longer sides in a fourth direction DR4 and relatively shorter sides in a fifth direction DR5 and each of the second emission areas GE1 may have relatively longer sides in the fifth direction DR5 and relatively shorter sides in the fourth direction DR4. The fourth direction DR4 may be a diagonal direction disposed between the X and Y directions, and the fifth direction DR5 may be a direction that intersects the fourth direction DR4. For example, the fifth direction DR5 may be orthogonal to the fourth direction DR4.

First emission areas RE and third emission areas BE may be alternately arranged in the X direction. The first emission areas RE may be arranged along the Y direction. The third emission areas BE may be arranged along the Y direction. As shown in the exemplary embodiment of FIG. 4, the first emission areas RE and the third emission areas BE may have a rhombus shape in a plan view (e.g., in a plane defined in the X and Y directions). In this exemplary embodiment, the first emission areas RE and the third emission areas BE may each have first sides that extend in the fourth direction DR4 and second sides that extend in the fifth direction DR5.

Figure 5:
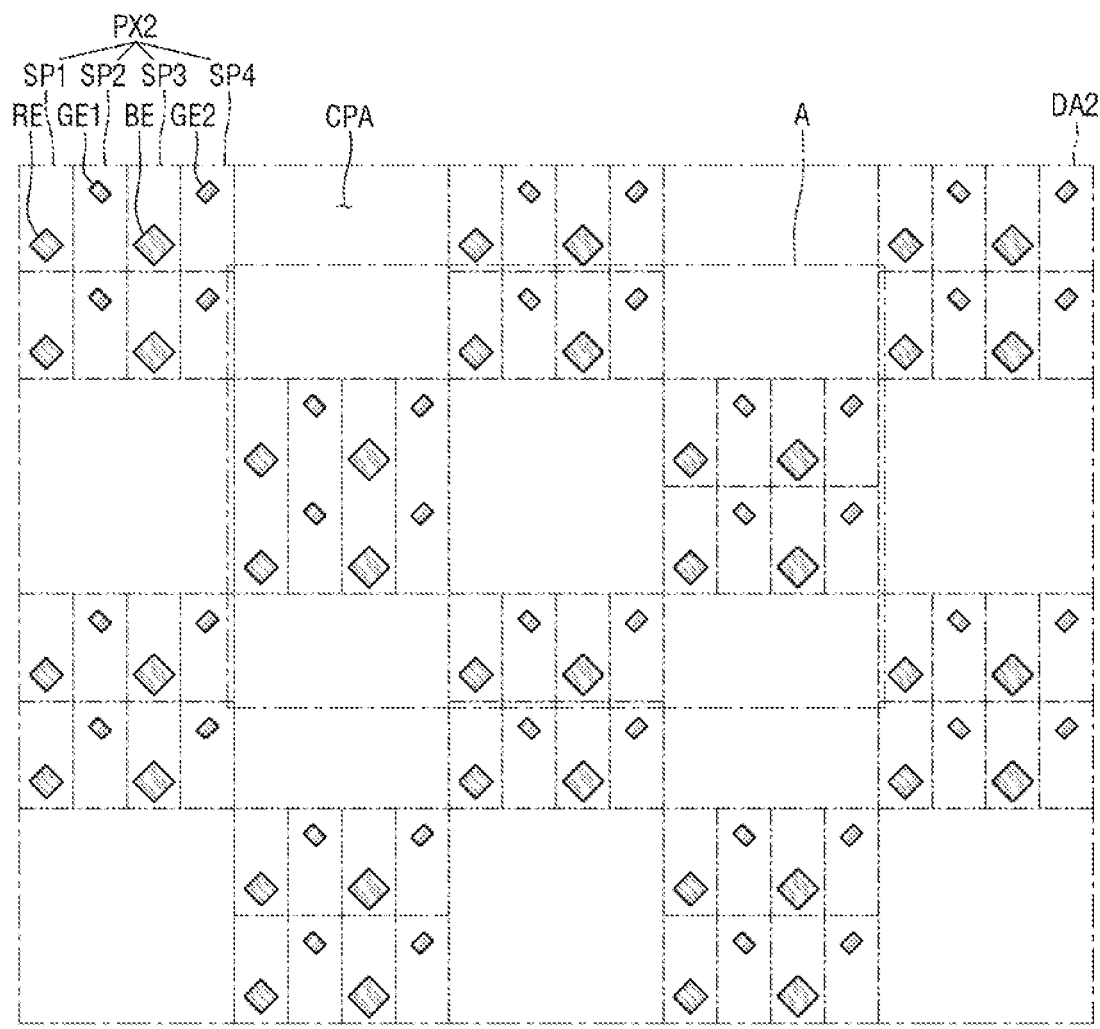
FIG. 5 is a layout view of a second display area of a first side portion of the display panel of FIG. 4 according to an exemplary embodiment of the present inventive concepts.

FIG. 5 is a layout view of a second display area DA2 of a first side portion SS1 of the display panel 100 of FIG. 4.

Referring to the exemplary embodiment of FIG. 5, the second display area DA2 of the first side portion SS1 may include second pixels PX2, which are for displaying an image, and crack prevention portions CPA.

Each of the second pixels PX2 may include first, second, third, and fourth subpixels SP1, SP2, SP3, and SP4. The first, second, third, and fourth subpixels SP1, SP2, SP3, and SP4 are substantially the same as their respective counterparts of FIG. 4, and thus, detailed descriptions thereof will be omitted for convenience of explanation.

The greater an angle θ1 at which the first side portion SS1 is bent from a front portion FS, the more likely the inorganic films in the first side portion SS1 are to crack. Thus, the second display area DA2 may include the crack prevention portions CPA, which preventing the propagation of cracks. The crack prevention portions CPA may not include at least some of the inorganic films. As a result, any cracks in the inorganic films may not be propagated further due to the crack prevention portions CPA.

The second pixels PX2 may be disposed on the crack prevention portions CPA. For example, the second pixels PX2 may be disposed adjacent to the crack prevention portions CPA (e.g., in the X and/or Y directions) and may not overlap with the crack prevention portions CPA. In an exemplary embodiment, the number of second pixels PX2 per unit area of the second display area DA2 may be less than the number of first pixels PX1 per unit area of the first display area DA1 of the front portion FS. For example, the space in which the crack prevention portions CPA are disposed may reduce the number of seco nd pixels PX2 per unit area in the second display area DA2 of the first side portion SS1. The unit area may be an area of any length which may be used for comparing a pixel density between various portions of the display device, etc.

The crack prevention portions CPA may be disposed adjacent to the second pixels PX2 in each of the X and Y directions. For example, the crack prevention portions CPA may be arranged in a zigzag fashion. The crack prevention portions CPA may be surrounded by the second pixels PX2. For example, each of the crack prevention portions CPA may be completely surrounded by the second pixels PX2 in the X and Y directions.

N second pixels PX2 may be disposed between each pair of adjacent crack prevention portions CPA in the X direction, N second pixels PX2 may be disposed between each pair of adjacent crack prevention portions CPA in the Y direction. In the exemplary embodiment of FIG. 5, two second pixels PX2 are disposed between each pair of adjacent crack prevention portions CPA in the X direction and between each pair of adjacent crack prevention portions CPA in the Y direction. However, exemplary embodiments of the present inventive concepts are not limited thereto and the number N of the second pixels PX2 disposed between each pair of adjacent crack prevention portions CPA in the X and Y directions may vary in other exemplary embodiments. Additionally, in some exemplary embodiments, the number of the second pixels PX2 disposed between each pair of adjacent crack prevention portions CPA in the X direction may be different than the number of the second pixels PX2 disposed between each pair of adjacent crack prevention portions CPA in the Y direction.

The second pixels PX and the crack prevention portions CPA may be alternately arranged in the X direction. For example, the second pixels PX2 and the crack prevention portions CPA may be arranged in the X direction in the order of two second pixels PX2, a crack prevention portion CPA, two second pixels PX2, and a crack prevention portion CPA.

The second pixels PX and the crack prevention portions CPA may be alternately arranged in the Y direction. For example, the second pixels PX2 and the crack prevention portions CPA may be arranged in the Y direction in the order of two second pixels PX2, a crack prevention portion CPA, two second pixels PX2, and a crack prevention portion CPA.

As illustrated in the exemplary embodiment of FIG. 5, space in which the crack prevention portions CPA are arranged may be secured by reducing the number of second pixels PX2 per unit area of the second display area DA2 of the first side portion SS1 to be smaller than the number of first pixels PX1 per unit area of the first display area DA1. Therefore, any cracks in the inorganic films in the first side portion SS1 may not be able to be propagated past the crack prevention portions CPA and thus the further propagation of the crack may be prevented.

A third display area DA3 of a second side portion SS2 of the display panel 100 may be substantially the same as the second display area DA2 of the first side portion SS1, and thus, a detailed description thereof will be omitted for convenience of explanation.

Figure 6:
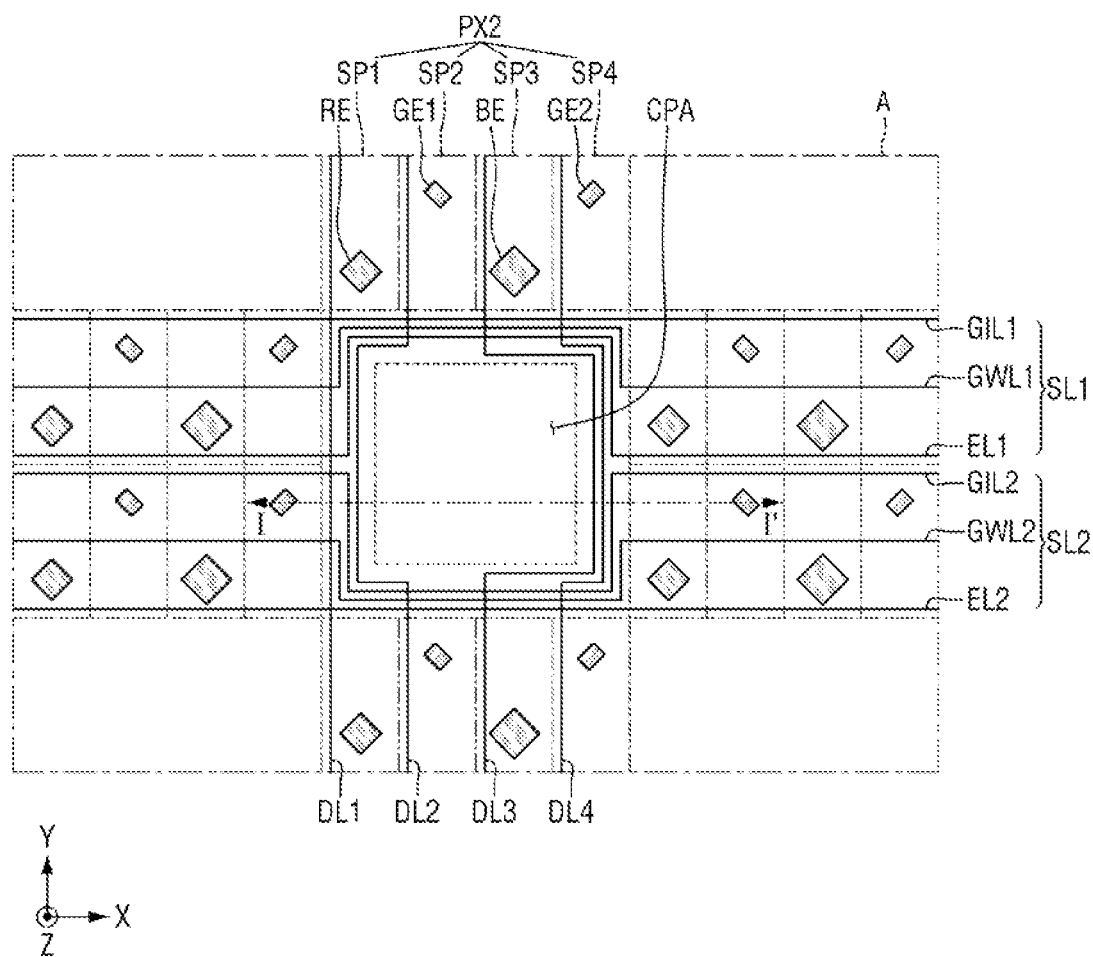
FIG. 6 is an enlarged layout view of area A of the display panel of FIG. 5 according to an exemplary embodiment of the present inventive concepts.

FIG. 6 is an enlarged layout view of a crack prevention portion CPA and adjacent second pixels PX2 in the first side portion SS1 of the display panel 100 of FIG. 5. FIG. 6 illustrates an enlarged view of an area A of FIG. 5.

For convenience of illustration, FIG. 6 illustrates first and second scan lines SL1 and SL2, which overlap with second pixels PX2 that are on the left or right side of a crack prevention portion CPA (e.g., in the X direction) and first to fourth data lines DL1, DL2, DL3, and DL4 which overlap with second pixels PX2 that are disposed on the upper or lower side of the crack prevention portion CPA (e.g., in the Y direction).

Figure 7:
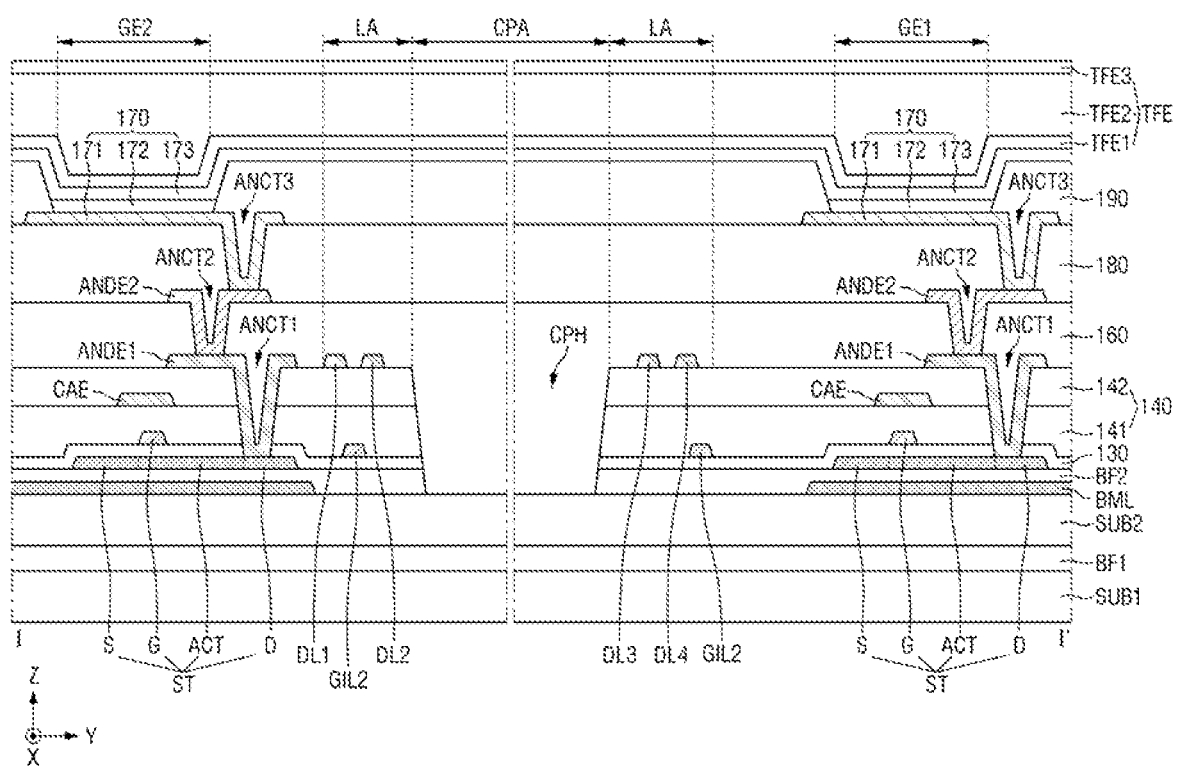
FIG. 7 is a cross-sectional view of the first side portion of the display panel of FIG. 4 according to an exemplary embodiment of the present inventive concepts.

Referring to the exemplary embodiment of FIG. 6, the first and second scan lines SL1 and SL2 and the first to fourth data lines DL1, DL2, DL3, and DL4 may be disposed between the crack prevention portion CPA and the second pixels PX2. The crack prevention portion CPA may be surrounded by a wiring area LA (FIG. 7). In an exemplary embodiment, at least one of scan lines, such as the first and second scan lines SL1, SL2, and data lines, such as first to fourth data lines DL1-DL4, are disposed between the second pixels PX2 and the crack prevention portion CPA.

In an exemplary embodiment in which the crack prevention portion CPA has a tetragonal shape in a plan view, the wiring area LA may also have the shape of a tetragonal frame in a plan view. However, exemplary embodiments of the present inventive concepts are not limited thereto. For example, in other exemplary embodiments, the crack prevention portion CPA may have a non-tetragonal polygonal shape, a circular shape, an elliptical shape, or an amorphous shape in a plan view, and the wiring area LA may also have the shape of a non-tetragonal polygonal frame, a circular frame, an elliptical frame, or an amorphous frame in a plan view.

The first scan line SL1 may include a plurality of sub-scan lines, such as a first scan initialization line GIL1, a first scan write line GWL1, and a first emission line EL1. As shown in the exemplary embodiment of FIG. 6, the first scan initialization line GIL1, the first scan write line GWL1, and the first emission line EL1 may overlap with upper second pixels PX2 among the second pixels PX2 disposed on the left side of the crack prevention portion CPA. The first scan initialization line GIL1, the first scan write line GWL1, and the first emission line EL1 may also overlap with upper second pixels PX2 among the second pixels PX2 disposed on the right side of the crack prevention portion CPA.

The first scan initialization line GIL1, the first scan write line GWL1, and the first emission line EL1 may extend in the X direction across the second pixels PX2. At least one of the first scan initialization line GIL1, the first scan write line GWL1, and the first emission line EL1 may be bent multiple times in the wiring area LA so that they do not extend in the crack prevention portion CPA. For example, the first scan initialization line GIL1, the first scan write line GWL1, and the first emission line EL1 may be bent in the Y direction on the left side of the wiring area LA, may be bent in the X direction at the corner where the left and upper sides of the wiring area LA meet, may be bent in the Y direction at the corner where the right and upper sides of the wiring area LA meet, and may be bent in the X direction on the right side of the wiring area LA. While the first scan initialization line GIL1 is not bent in the wiring area LA in the exemplary embodiment of FIG. 6, exemplary embodiments of the present inventive concepts are not limited thereto.

Due to the presence of the wiring area LA, the size of each crack prevention portion CPA may be smaller than the combined size of N second pixels PX2. For example, the size of the crack prevention portion CPA may be smaller than the combined size of N second pixels PX2 in the X and/or Y directions. The size of the crack prevention portion CPA decreases as the size of the wiring area LA increases. As the size of the crack prevention portion CPA decreases, there is a greater likelihood that the cracks in the inorganic films may be propagated through the crack prevention portion CPA. Thus, to minimize the size of the wiring area LA, the distances between the first scan initialization line GIL A and the first scan write line (GWL1 and between the first scan write line GWL1 and the first emission line EL1 may be smaller in the wiring area LA than these distances are in portions of the first scan initialization line GIL1, the first scan write line GWL1 and the first emission line EL1 that overlap the second pixels PX2.

A second scan line SL2 may include a plurality of sub-scan lines, such as a second scan initialization line GIL2, a second scan write line GWL2, and a second emission line EL2. The second scan initialization line GIL2, the second scan write line GWL2, and the second emission line EL2 may overlap with lower second pixels PX2 among the second pixels PX2 disposed on the left side of the crack prevention portion CPA. The second scan initialization line GIL2, the second scan write line GWL2, and the second emission line EL2 may also overlap with lower second pixels PX2 among the second pixels PX2 disposed on the right side of the crack prevention portion CPA.

The second scan initialization line GIL2, the second scan write line GWL2, and the second emission line EL2 may extend in the X direction across the second pixels PX2. The second scan initialization line GIL2, the second scan write line GWL2, and the second emission line EL2 may be bent multiple times in the wiring area LA so that they do not extend in the crack prevention portion CPA. For example, the second scan initialization line GIL2, the second scan write line GWL2, and the second emission line EL2 may be bent in the Y direction on the left side of the wiring area LA, may be bent in the X direction at the corner where the left and lower sides of the wiring area LA meet, may be bent in the Y direction at the corner where the right and lower sides of the wiring area LA meet, and may be bent in the X direction on the right side of the wiring area LA. While the second emission line EL2 is not bent in the wiring area LA in the exemplary embodiment of FIG. 6, exemplary embodiments of the present inventive concepts are not limited thereto.

To minimize the size of the wiring area LA, the distances between the second scan initialization line GIL2 and the second scan write line (GWL2 and between the second scan write line GWL2 and the second emission line EL2 may be smaller in the wiring area LA than these distances are in portions of the second scan initialization line GIL2, the second scan write line GWL2 and the second emission line EL2 that overlap the second pixels PX2.

The first to fourth data lines DL1, DL2, DL3, and DL4 may overlap with the second pixels PX2 that are disposed on the upper or lower side of the crack prevention portion CPA (e.g., in the Y direction). The first to fourth data lines DL1, DL2, DL3, and DL4 may extend in the Y direction across the second pixels PX2.

The data lines (DL1, DL2, DL3, and DL4) may be bent multiple times in the wiring area LA so that the do not extend within the crack prevention portion CPA. For example, the first and second data lines DL1 and DL2 may be bent in the X direction on the upper side of the wiring area LA, may be bent in the Y direction at the corner where the left and tipper sides of the wiring area LA meet, may be bent in the X direction at the corner where the left and lower sides of the wiring area LA meet, and may be bent in the Y direction on the lower side of the wiring area LA. While the first data line DL1 is not bent in the wiring area LA in the exemplary embodiment of FIG. 6, exemplary embodiments of the present inventive concepts are not limited thereto. For example, the third and fourth data lines DL3 and DL4 may be bent in the X direction on the upper side of the wiring area LA, may be bent in the Y direction at the corner where the right and upper sides of the wiring area LA meet, may be bent in the X direction at the corner where the right and lower sides of the wiring area LA meet, and may be bent in the Y direction on the lower side of the wiring area LA.

To minimize the size of the wiring area LA, the distances between the first data line DL1 and the second data line DL2 and between the third and fourth data lines DL3 and DL4 may be smaller in the wiring area LA than these distances are in portions of the first to fourth data line DL1-DL4 that overlap the second pixels PX2.

FIG. 7 is a cross-sectional view of an example of the first side portion SS1 of the display panel 100 of FIG. 4. FIG. 7 illustrate an exemplary cross-sectional view, taken along line I-I' of FIG. 6, of the display panel of FIG. 5.

Referring to the exemplary embodiment of FIG. 7, a first buffer film BF1 may be disposed on a first substrate SUB1, a second substrate SUB2 may be disposed on the first buffer film BF1, and a second buffer film BF2 may be disposed on the second substrate SUB2.

In an exemplary embodiment, the first and second substrates SUB1 and SUB2 may be formed of an insulating material such as a polymer resin. For example, the first and second substrates SUB1 and SUB2 may include polyimide. The first and second substrates SUB1 and SUB2 may be flexible substrates that are bendable, foldable, or rollable. However, exemplary embodiments of the present inventive concepts are not limited thereto.

The first and second buffer films BF1 and BF2 may be films for protecting thin-film transistors (TFTs) ST of a TFT layer and light-emitting layers 172 of a light-emitting element layer EML from moisture that may penetrate the first and second substrates SUB1 and SUB2, which are susceptible to moisture. Each of the first and second buffer films BF1 and BF2 may consist of a plurality of inorganic films that are alternately stacked. For example, each of the first and second buffer films BF1 and BF2 may be formed as a multilayer film in which at least one inorganic film selected from among a silicon nitride layer, a silicon oxynitride layer, a silicon oxide layer, a titanium oxide layer, and an aluminum oxide layer are alternately stacked.

A light-blocking layer BML may be disposed on the second substrate SUB2. The light-blocking layer BML may be disposed to overlap with active layers ACT of the TFTs ST in the Z direction to prevent the generation of a leakage current when light is incident upon the active layers ACT of the TFTs ST. In an exemplary embodiment, the light-blocking layer BML may be formed as a single- or multilayer film including molybdenum (Mo), aluminum (Al), chromium (Cr), gold (Au), titanium (Ti), nickel (Ni), neodymium (Nd), copper (Cu), and an alloy thereof. However, exemplary embodiments of the present inventive concepts are not limited thereto and in some exemplary embodiments the light-blocking layer BML may not be provided.

The active layers ACT of the TFTs ST may be disposed on the second buffer film BF2. For example, as shown in the exemplary embodiment of FIG. 7, a lower surface of the active layers ACT of the TFTs ST may directly contact an upper surface of the second buffer film BF2. In an exemplary embodiment, the active layers ACT of the TFTs ST may include at least one compound selected from polycrystalline silicon, monocrystalline silicon, low-temperature polycrystalline silicon, amorphous silicon, and an oxide semiconductor. The active layers ACT of the TFTs ST that are not covered (e.g., are exposed) by a gate insulating film 130 may be doped with impurities or ions and may thus have conductivity. Thus, source electrodes S and drain electrodes D of the TFTs ST that have conductivity may be formed.

The gate insulating film 130 may be disposed on portions (e.g., partial portions) of the active layers ACT of the TFTs ST. In an exemplary embodiment, the gate insulating film 130 may be formed as an inorganic film and may include at least one layer selected from a silicon nitride layer, a silicon oxynitride layer, a silicon oxide layer, a titanium oxide layer, and an aluminum oxide layer.

Gate electrodes C of the TFTs ST and the scan lines (SL1 and SL2) may be disposed on the gate insulating film 130. For example, as shown in the exemplary embodiment of FIG. 7, a lower surface of the gate electrodes G of the TFTs ST may directly contact an upper surface of the gate insulating film 130. The gate electrodes G of the TFTs ST may overlap with the active layers ACT in the Z direction. FIG. 7 illustrates only the second scan initialization line GIL2 among the sub-scan lines of each of the first and second scan lines SL1 and SL2. In an exemplary embodiment, the gate electrodes G of the TFTs ST and the first and second scan lines SI and SL2 may be formed as single- or multilayer layers which include at least one compound selected from Mo, Al, Cr, Au, Ti, Ni, Nd, Cu, and an alloy thereof.

A first interlayer insulating film 141 may be disposed on the gate electrodes G of the TFTs ST and the first and second scan lines SL1 and SL2. In an exemplary embodiment, the first interlayer insulating film 141 may be formed as an inorganic film such as, for example, at least one layer selected from a silicon nitride layer, a silicon oxynitride layer, a silicon oxide layer, a titanium oxide layer, and an aluminum oxide layer. The first interlayer insulating film 141 may include a plurality of inorganic films.

Capacitor electrodes CAE may be disposed on the first interlayer insulating film 141. The capacitor electrodes CAE may overlap with the gate electrodes G of the TFTs ST in the Z direction. Since the first interlayer insulating film 141 has a predetermined dielectric constant, capacitors may be formed between the capacitor electrodes CAE, the gate electrodes G, and the first interlayer insulating film 141. In an exemplary embodiment, the capacitor electrodes CAE may be formed as single- or multilayer layers that include at least one compound selected from Mo, Al, Cr, Au, Ti, Ni, Nd, Cu, and an alloy thereof.

A second interlayer insulating film 142 may be disposed on the capacitor electrodes CAE. The second interlayer insulating film 142 may be formed as an inorganic film such as, for example, at least one layer selected from a silicon nitride layer, a silicon oxynitride layer, a silicon oxide layer, a titanium oxide layer, and an aluminum oxide layer. The second interlayer insulating film 142 may include a plurality of inorganic films.

First anode connecting electrodes ANDE1 and the first to fourth data lines DL1, DL2, DL3, and DL4 may be disposed on the second interlayer insulating film 142. The first anode connecting electrodes ANDE1 may be connected to the drain electrodes 1) of the TFTs ST through first anode contact holes ANCT1, which expose the drain electrodes D of the TFTs ST through the first and second interlayer insulating films 141 and 142. The first anode connecting electrodes ANDE1 and the first to fourth data lines DL1, DL2, DL3, and DL4 may be formed as single- or multilayer layers that include at least one compound selected from Mo, Al, Cr, Au, Ti, Ni, Nd, Cu, and an alloy thereof.

A first organic film 160, which is for planarization, may be disposed on the first anode connecting electrodes ANDE1 and the first to fourth data lines DL1, DL2, DL3, and DL4. In an exemplary embodiment, the first organic film 160 may be formed as an organic film including an acrylic resin, an epoxy resin, a phenolic resin, a polyamide resin, or a polyimide resin.

Second anode connecting electrodes ANDE2 may be disposed on the first organic film 160. The second anode connecting electrodes ANDE2 may be connected to the first anode connecting electrodes ANDE1 through second anode contact holes ANCT2, which expose the first anode connecting electrodes ANDE1 through the first organic film 160. In an exemplary embodiment, the second anode connecting electrodes ANDE2 may be formed as single- or multilayer layers that include at least one compound selected from Mo, Al, Cr, Au, Ti, Ni, Nd, Cu, and an alloy thereof.

A second organic film 180 may be disposed on the second anode connecting electrodes ANDE2. The second organic film 180 may be formed as an organic film including an acrylic resin, an epoxy resin, a phenolic resin, a polyamide resin, or a polyimide resin.

FIG. 7 illustrates that the TFTs ST are formed as top-gate TFTs in which the gate electrodes G are disposed above the active layers ACT. However, exemplary embodiments of the present inventive concepts are not limited thereto. For example in other exemplary embodiments, the TFTs ST may be formed as bottom-gate TFTs in which the gate electrodes G are disposed below the active layers ACT or as double-gate TFTs in which the gate electrodes G are disposed both above and below the active layers ACT.

Light-emitting elements 170 and a bank 190 may be disposed on the second organic film 180. Each of the light-emitting elements 170 may include a first light-emitting electrode 171, a light-emitting layer 172, and a second light-emitting electrode 173.

The first light-emitting electrodes 171 may be disposed on the second organic film 180. The first light-emitting electrodes 171 may be connected to the second anode connecting electrodes ANDE2 through third anode contact holes ANCT3, which expose the second anode connecting electrodes ANDE2 through the second organic film 180.

In a top-emission structure that emits light in a direction from the light-emitting layer 172 to the second light-emitting electrode 173, the first light-emitting electrodes 171 may be formed of a metallic material with high reflectance such as a stack of Al and Ti (e.g., Ti/Al/Ti), a stack of Al and indium tin oxide (ITO) (e.g., ITO/Al/ITO), a silver (Ag)-palladium (Pd)-copper (Cu) (APC) alloy, or a stack of an APC alloy and ITO (e.g., ITO/APC/ITO).

The bank 190 may be disposed on the second organic film 180 to separate the first light-emitting electrodes 171 and thus to define the first to fourth emission areas RE, GE1, BE, and GE2. As shown in the exemplary embodiment of FIG. 7, the bank 190 may be formed to cover lateral edges of each of the first light-emitting electrodes 171. In an exemplary embodiment, the bank 190 may be formed as an organic film that includes at least one material selected from an acrylic resin, an epoxy resin, a phenolic resin, a polyamide resin, and a polyimide resin.

The first to fourth emission areas RE, GE1, BE, and GE2 may refer to regions where the first light-emitting electrodes 171, the light-emitting layers 172, and the second light-emitting electrode 173 are sequentially stacked so that holes from the first light-emitting electrodes 171 and electrons from the second light-emitting electrode 173 combine together in the light-emitting layers 172 to emit light.

For convenience, FIG. 7 illustrates only the second and fourth emission areas GE1 and GE2 of the first to fourth emission areas RE, GE1, BE, and GE2. First emission areas RE and third emission areas BE may be substantially the same as the second and fourth emission areas GE1 and GE2 of FIG. 7, and thus, detailed descriptions thereof will be omitted for convenience of explanation.

The light-emitting layers 172 are disposed on the first light-emitting electrodes 171 and the bank 190. In an exemplary embodiment, the light-emitting layers 172 may include an organic material and may thus emit light of a particular color. For example, the light-emitting layers 172 may include hole transport layers, organic material layers, and electron transport layers.

The second light-emitting electrode 173 are disposed on the light-emitting layers 172. The second light-emitting electrode 173 may be arranged to extend (e.g., in the Y direction) to cover each of the light-emitting layers 172. For example, the second light-emitting electrode 173 may be a common layer formed in common throughout all the first to fourth emission areas RE, GE1, BE, and GE2. A capping layer may be disposed on the second light-emitting electrode 173.

In the top-emission structure, the second light-emitting electrode 173 may be formed of a transparent metallic material such as at least one compound selected from ITO or indium zinc oxide (ZO) or a semitransparent metallic material such as magnesium (Mg), Ag, or an alloy thereof. In an exemplary embodiment in which the second light-emitting electrode 173 is formed of a semitransparent metallic material, the emission efficiency of the second light-emitting electrode 173 may be improved due to micro-cavities.

An encapsulation layer TFE may be disposed on the second light-emitting electrode 173. The encapsulation layer TFE may include at least one inorganic film for preventing the penetration of oxygen or moisture into the light-emitting element layer EML The encapsulation layer TFE may also include at least one organic film for protecting the light-emitting element layer EML from foreign materials such as dust. For example, as shown in the exemplary embodiment of FIG. 7, the encapsulation layer TFE may include a first inorganic film TFE1, an organic film TFE2, and a second inorganic film TFE3.

The first inorganic film TFE1 may be disposed on the second light-emitting electrode 173, the organic film TFE2 may be disposed on the first inorganic film TFE1, and the second inorganic film TFE3 may be disposed on the organic film TFE2. Each of the first and second inorganic films TFE1 and TFE3 may be formed as a multilayer film in which at least one inorganic film selected from among a silicon nitride layer, a silicon oxynitride layer, a silicon oxide layer, a titanium oxide layer, and an aluminum oxide layer is alternately stacked. The organic film TFE2 may include a monomer.

Referring to the exemplary embodiment of FIG. 7, the second buffer film BF2, the gate insulating film 130, the first interlayer insulating film 141, and the second interlayer insulating film 142 may not be included in the crack prevention portion CPA. For example, a hole CPH which exposes the second substrate SUB2 through the second buffer film BF2, the gate insulating film 130, the first interlayer insulating film 141, and the second interlayer insulating film 142, may be formed in the crack prevention portion CPA. In an exemplary embodiment, the hole CPH may be filled with the first organic film 160. For example, a lower surface of the first organic film 160 may directly contact an upper surface of the second substrate SUB2.

In an exemplary embodiment, the second interlayer insulating film 142 may be disposed only on the first interlayer insulating film 141. In this exemplary embodiment, the second interlayer insulating film 142 may not cover lateral side surfaces of each of the second buffer film BF2, the gate insulating film 130, and the first interlayer insulating film 141 that are exposed through the hole CPH.

Alternatively, as illustrated in the exemplary embodiment of FIG. 7, the second interlayer insulating film 142 may be disposed on the lateral side surfaces of each of the second buffer film BF2 and the first interlayer insulating film 141 that are exposed through the hole CPH, to improve an encapsulation effect. In an exemplary embodiment, lateral side surfaces of the gate insulating film 130 may also be disposed proximate the hole CPH and the second interlayer insulating film 142 may be disposed on the lateral side surfaces of the gate insulating film 130. The second interlayer insulating film 142 may be disposed on partial portion of the second substrate SUB2 that is exposed through the hole (PH.

Referring to the exemplary embodiment of FIG. 7, even if cracks are generated in at least one of the second buffer film BF2, the gate insulating film 130, and the first interlayer insulating film 141, the cracks cannot be propagated any further by the crack prevention portion CPA because the second buffer film BF2, the gate insulating film 130, the first interlayer insulating film 141, and the second interlayer insulating film 142 are not included in (e.g., removed from) the crack prevention portion CPA.

Figure 8:
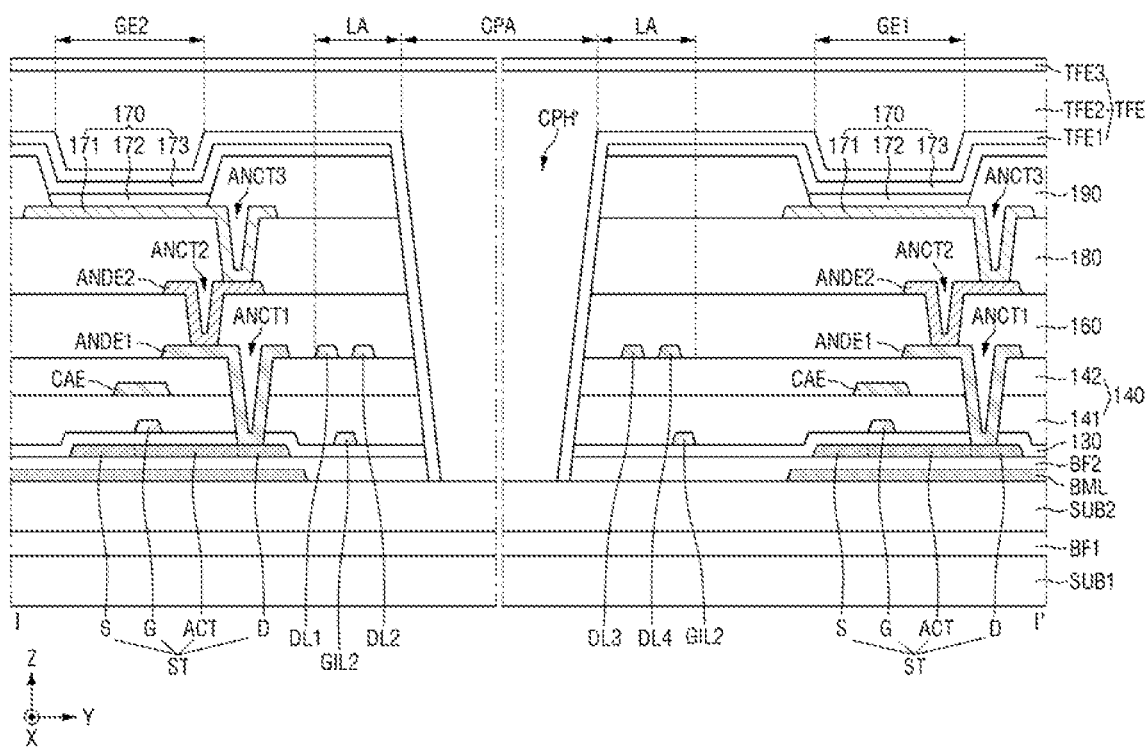
FIG. 8 is a cross-sectional view of the first side portion of the display panel of FIG. 4 according to another exemplary embodiment of the present inventive concepts.

FIG. 8 is a cross-sectional view of another example of the first side portion SS1 of the display panel 100 of FIG. 4. FIG. 8 illustrates another exemplary cross-sectional view, taken along line I-I' of FIG. 6, of the display panel 100 of FIG. 5.

The exemplary embodiment of FIG. 8 differs from the exemplary embodiment of FIG. 7 based on the hole CPH' in the crack prevention portion CPA not including the first organic film 160, the second organic film 180, and the bank 190 in addition to the second buffer film BF2, the gate insulating film 130, the first interlayer insulating film 141, and the second interlayer insulating film 142. The exemplary embodiment of FIG. 8 will hereinafter be described, focusing mainly on the differences with the embodiment of FIG. 7 and a repeated description of substantially identical elements will be omitted for convenience of explanation.

Referring to FIG. 8, a hole CPH', which exposes the second substrate SUB2 through the second buffer film BF2, the first interlayer insulating film 141, the second interlayer insulating film 142, the first organic film 160, the second organic film 180, and the bank 190, may be formed in the crack prevention portion CPA. The hole CPH' may be filled with the organic film TFE2 of the encapsulation layer TFE. The organic film TFE2 of the encapsulation layer TFE may be in contact with the second substrate SUB2. For example, as shown in the exemplary embodiment of FIG. 8, a lower surface of the organic film TFE2 may directly contact an upper surface of the second substrate SUB2.

The first inorganic film TFE1 of the encapsulation layer TFE may be disposed on lateral side surfaces of each of the second buffer film BF2, the gate insulating film 130, the first interlayer insulating film 141, the first organic film 160, the second organic film 180, and the bank 190 that are exposed through the hole CPH', to increase the encapsulation effect of the encapsulation layer TFE. Additionally, the first inorganic film TFE1 of the encapsulation layer may directly contact a partial portion of the second substrate SUB2 that is exposed by the hole CPH'.

Alternatively, the first inorganic film TFE1 of the encapsulation layer TFE may not cover the lateral side surfaces of each of the second buffer film BF2, the gate insulating film 130, the first interlayer insulating film 141, the first organic film 160, the second organic film 180, and the bank 190 that are exposed through the hole CPH'. In this exemplary embodiment, the first inorganic film TFE1 of the encapsulation layer TFE may be disposed only on the bank 190.

As illustrated in the exemplary embodiment of FIG. 8, even if cracks are generated in at least one of the second buffer film BF2, the first interlayer insulating film 141, and the second interlayer insulating film 142, the cracks are not propagated through the crack prevention portion CPA because the second buffer film BF2, the gate insulating film 130, and the second interlayer insulating film 142 are not included in the crack prevention portion CPA.

In an exemplary embodiment in which the first organic film 160, the second organic film 180, and the bank 190 are formed of polyimide, which has a high absorption rate for short-wavelength light (e.g., blue light) and is thus capable of short-wavelength light, the crack prevention portion CPA with the first organic film 160, the second organic film 180, and the bank 190 removed therefrom may serve as a transmissive region that can transmit light therethrough.

In an exemplary embodiment in which a sensor device is disposed to overlap with the crack prevention portions CPA (e.g., in the Z direction) in the first side portion SS1, the sensor device may detect light incident from the front of the display device 10 through the crack prevention portions CPA. For example, the sensor device may be an image sensor for capturing an image, a proximity sensor for detecting an object in the proximity of the front surface of the display device 10, or an illuminance sensor for detecting the illuminance at the front surface of the display device 10.

Figure 9:
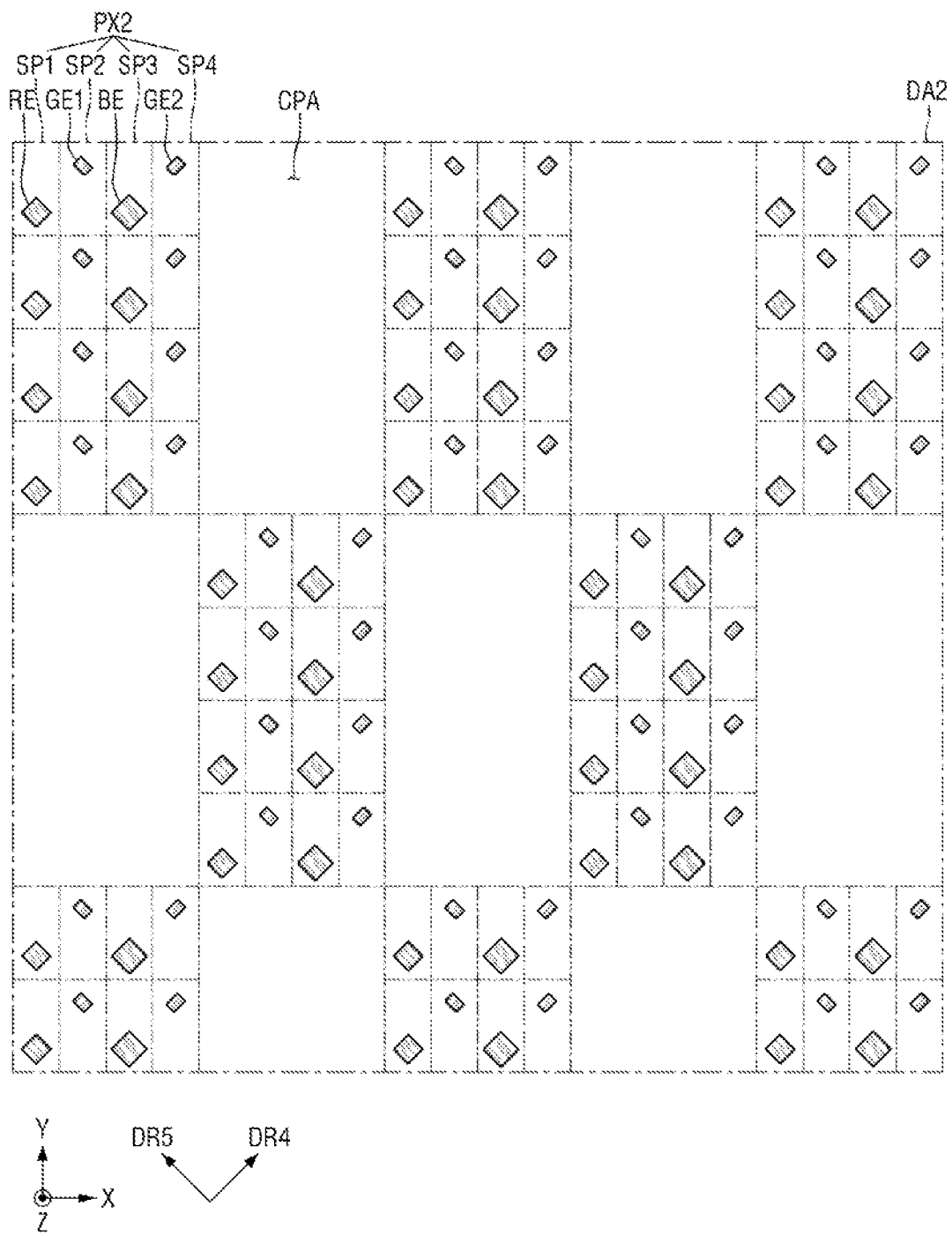
FIG. 9 is a layout view of a second display area of a first side portion of a display panel according to an exemplary embodiment of the present inventive concepts.

FIG. 9 is a layout view of a second display area DA2 of a first side portion SS1 of a display panel 100 according to another exemplary embodiment of the present inventive concepts.

The exemplary embodiment of FIG. 9 differs from the exemplary embodiment of FIG. 5 by including four second pixels PX2 that are disposed between each pair of adjacent crack prevention portions CPA in the X direction and between each pair of adjacent crack prevention portions CPA in the Y direction. Therefore, a detailed description of substantially identical elements included in the exemplary embodiment of FIG. 9 will be omitted for convenience of explanation.

A third display area DA3 of a second side portion SS2 of the display panel 100 may be substantially the same as the second display area DA2 of the first side portion SS1 of the exemplary embodiment of FIG. 9, and thus, a detailed description thereof will be omitted for convenience of explanation.

Figure 10:
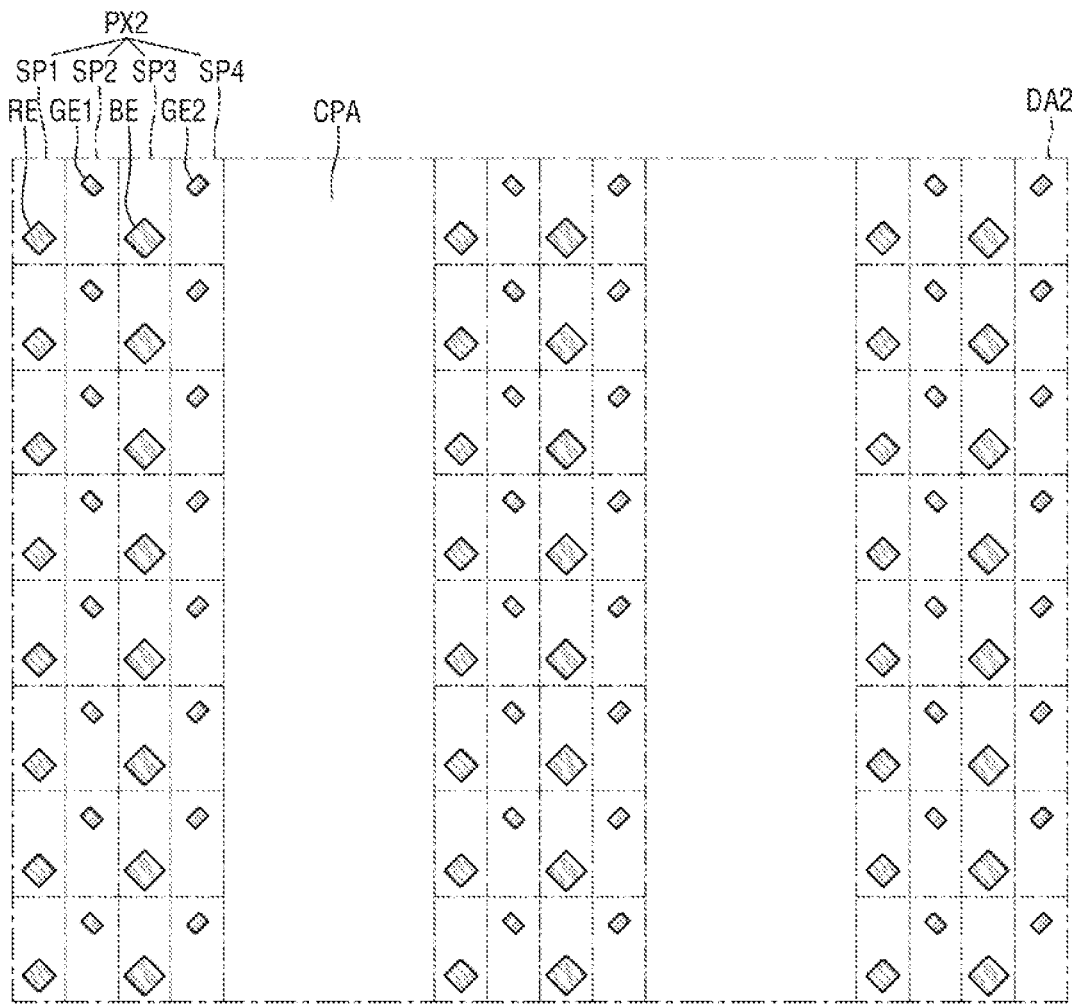
FIG. 10 is a layout view of a second display area of a first side portion of a display panel according to an exemplary embodiment of the present inventive concepts.

FIG. 10 is a layout view of a second display area DA2 of a first side portion SS1 of a display panel 100 according to another exemplary embodiment of the present inventive concepts.

The exemplary embodiment of FIG. 10 differs from the exemplary embodiment of FIG. 5 based on the crack prevention portions CPA and second pixels PX2 both extending longitudinally in the Y direction and are alternately arranged in the X direction. Thus, a repeated description of substantially identical elements included in the prior exemplary embodiments will be omitted for convenience of explanation. However, exemplary embodiments of the present inventive concepts are not limited thereto and the crack prevention portions CPA and second pixels PX2 may extend longitudinally in one direction and the second pixels PX2 may be arranged in the one direction that is different than the Y direction. For example, in another exemplary embodiment, the crack prevention portions CPA and second pixels PX2 may both extend longitudinally in the X direction and may be alternately arranged in the Y direction.

A third display area DA3 of a second side portion SS2 of the display panel 100 may be substantially the same as the second display area DA2 of the first side portion SS1 of FIG. 10, and thus, a detailed description thereof will be omitted for convenience of explanation.

Figure 11:
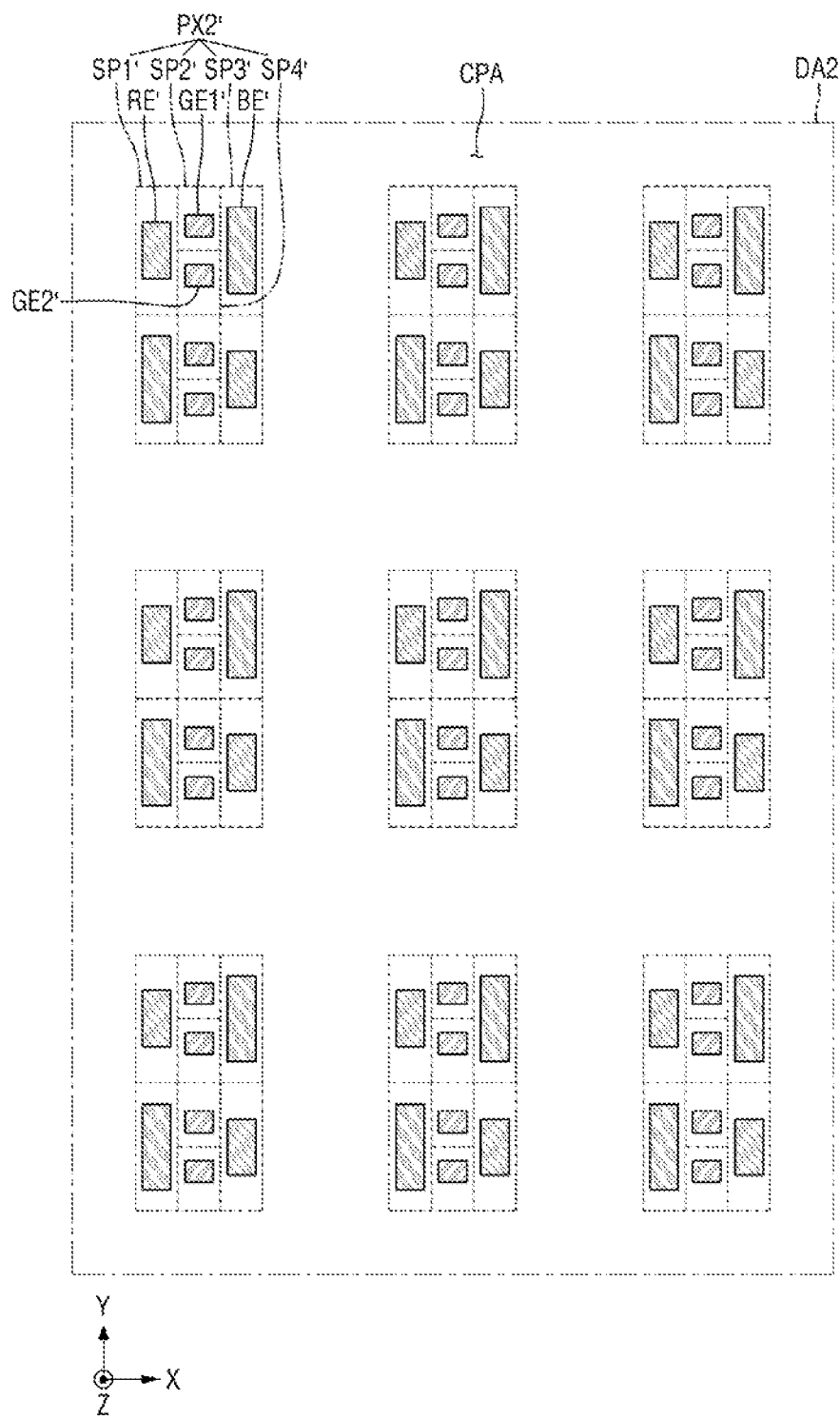
FIG. 11 is a layout view of a second display area of a first side portion of a display panel according to another exemplary embodiment of the present inventive concepts.

FIG. 11 is a layout view of a second display area DA2 of a first side portion SS1 of a display panel 100 according to another exemplary embodiment of the present inventive concepts.

The exemplary embodiment of FIG. 11 differs from the exemplary embodiment of FIG. 5 based on the second pixels PX2' of a second display area DA2 having a different shape from the first pixels PX1 of a first display area DA1.

Referring to the exemplary embodiment of FIG. 11, each of the second pixels PX2 may include first, second, third, and fourth subpixels SP1', SP2', SP3', and SP34'. The second and fourth subpixels SP2' and SP4' may be disposed between the first and third subpixels SP1' and SP3' in the X direction. The second and fourth subpixels SP2' and SP4' may be arranged in the Y direction. The second subpixel SP2' may be disposed above the fourth subpixel SP4'. The length, in the Y direction, of the first subpixel SP1' and the fourth subpixel SP4' may be greater than the lengths, in the Y direction, of the second and fourth subpixels SP2' and SP4'. For example, as shown in the exemplary embodiment of FIG. 11, the lengths of the second and the fourth subpixels SP2', SP4' in the Y direction may each be approximately half the size of the lengths of the first and the third subpixels SP1', SP3' in the Y direction. The combined length of the second and the fourth subpixels SP2', SP4' in the Y direction may be approximately the same as the length of the first and the third subpixels SP1', SP3' in the Y direction.

First emission areas RE' and third emission areas B may each have a rectangular shape having relatively shorter sides in the X direction and relatively longer sides in the Y direction in a plan view. However, exemplary embodiments of the present inventive concepts are not limited thereto. Alternatively, the first emission areas RE and the third emission areas BE' may have a non-rectangular tetragonal shape, a non-tetragonal polygonal shape, a circular shape, or an elliptical shape in a plan view. The size of the third emission areas BE' may be greater than the size of the first emission areas RE'. The length in the Y direction of the first emission areas RE' may be greater than the length, in the Y direction of the third emission areas BE'.

Second emission areas GE1' and fourth emission areas GE2' may each have a rectangular shape having relatively shorter sides in the X direction and relatively longer sides in the Y direction in a plan view (e.g., in a plane defined in the X and Y directions). However, exemplary embodiments of the present inventive concepts are not limited thereto. Alternatively, the second emission areas GE1' and the fourth emission areas GE2' may have a non-rectangular tetragonal shape, a non-tetragonal polygonal shape, a circular shape, or an elliptical shape in a plan view. As shown in the exemplary embodiment of FIG. 11, the second emission areas GE1' and the fourth emission areas GE2' may have the same size.

A crack prevention portion CPA may be disposed to surround every P second pixels PX2' (where P is a positive integer). FIG. 11 illustrates that the crack prevention portion CPA surrounds every two adjacent second pixels PX2' that are adjacent to each other in the Y direction. As shown in the exemplary embodiment of FIG. 11, the crack prevention portion CPA may completely surround the two adjacent second pixels PX2' (e.g., in the X and Y directions). However exemplary embodiments of the present inventive concepts are not limited thereto. Alternatively, the crack prevention portion CPA may be disposed to surround every two adjacent second pixels PX2' that are adjacent to each other in the X direction. Alternatively, the crack prevention portion CPA may be disposed to surround every three adjacent second pixels PX2' that adjacent to each other in the X direction or in the Y direction. Alternatively, the crack prevention portion CPA may be disposed to surround every four or more adjacent second pixels PX2' that are adjacent to each other in the X direction or in the Y direction.

As illustrated in the exemplary embodiment of FIG. 11, the crack prevention portion CPA is disposed to surround the adjacent second pixels PX2' in both the X and Y direction. Thus, even if cracks are generated in inorganic films in the first side portion SS1, the cracks cannot be propagated any further by the crack prevention portion CPA.

A third display area DA3 of a second side portion SS2 of the display panel 100 may be substantially the same as the second display area DA2 of the first side portion SS1 of FIG. 11, and thus, a detailed description thereof will be omitted for convenience of explanation.

Figure 12:
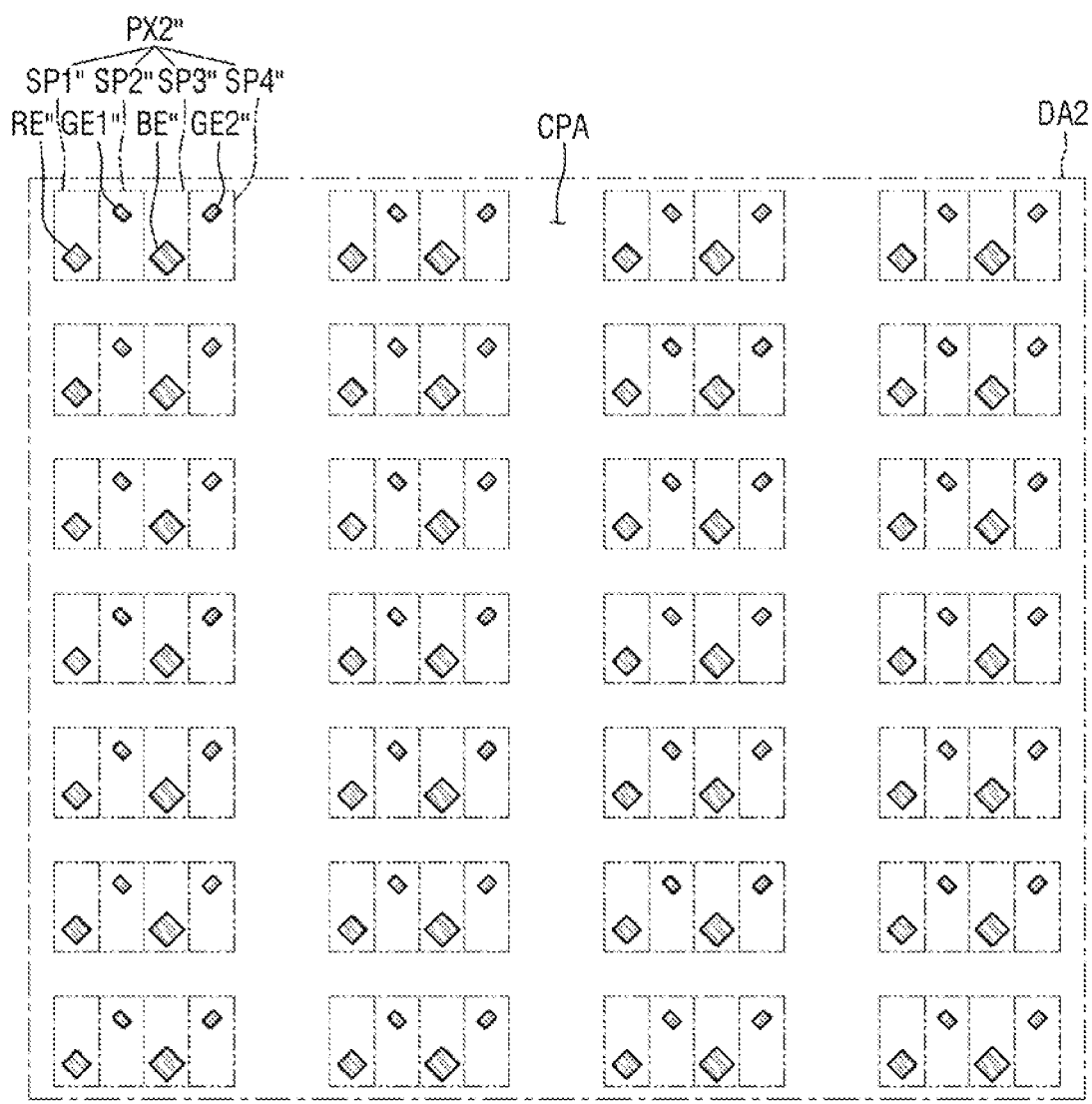
FIG. 12 is a layout view of a second display area of a first side portion of a display panel according to another exemplary embodiment of the present inventive concepts.

FIG. 12 is a layout view of a second display area DA2 of a first side portion SS1 of a display panel 100 according to another exemplary embodiment of the present inventive concepts.

The exemplary embodiment of FIG. 12 differs from the exemplary embodiment of FIG. 5 based on the size of second pixels PX2" of the second display area DA2 differing from the size of the first pixels PX1 of a first display area DAL Referring to the exemplary embodiment of FIG. 12, the size of second pixels PX2" of a second display area DA2 may be smaller than the size of first pixels PX1 of a first display area DA1. In contrast to the exemplary embodiment of FIG. 5 in which a pair of second pixels PX2 that are adjacent to each other in the Y direction are in direct contact with each other, in the exemplary embodiment of FIG. 12, each of the second pixels PX2" are spaced apart from each other in both the X and Y directions. As a result, a crack prevention portion CPA may be disposed between every two adjacent second pixels PX2" in both the X and Y directions. Accordingly, there is no need to secure separate space for the crack prevention portion CPA and the crack prevention portion CPA may be disposed in the existing spaces between adjacent second pixels PX2". Thus, the number of second pixels PX2" per unit area of the second display area DA2 of the first side portion SS1 may be substantially the same as the number of first pixels PX1 of the first display area DA1 of a front portion FS. Therefore, the resolution of the first side portion SS1 may be substantially the same as the resolution of the front portion FS.

Since the size of the second pixels PX2" of the second display area DA2 is smaller than the size of the first pixels PX1 of the first display area DA1, the sizes of first, second, third, and fourth subpixels SP1", SP2", SP3", and SP4" of each of the second pixels PX2" may be smaller than the sizes of first, second, third, and fourth subpixels SP1, SP2, SP3, and SP4 of each of the first pixels PX1.

Also, since the size of the second pixels PX2" of the second display area DA2 is smaller than the size of the first pixels PX of the first display area DA1, the sizes of first, second, third, and fourth emission areas RE", GE1", BE", and GE2" of each of the second pixels PX2" may be smaller than the sizes of first, second, third, and fourth emission areas RE, GE1, BE, and GE2 of each of the first pixels PX1. The shapes of the first, second, third, and fourth emission areas RE", GE1", BE", and GE2" of each of the second pixels PX2" may be substantially the same as the shapes of the first, second, third, and fourth emission areas RE, GE, BE, and GE2 of each of the first pixels PX1.

As illustrated in the exemplary embodiment of FIG. 12, the size of each of the second pixels PX2" of the second display area DA2 of the first side portion SS1 may be reduced to be smaller than the size of each of the first pixels PX1 of the first display area DA1 of the front portion FS. As a result, even if the number of second pixels PX2" per unit area of the second display area DA2 of the first side portion SS1 is the same as the number of first pixels PX1 per unit area of the first display area DA1 of the front portion FS, the crack prevention portion CPA may be provided in the first side portion SS1 Thus, the propagation of cracks in inorganic films may be prevented by the crack prevention portion CPA without the need to secure separate space for the crack prevention portion CPA.

A third display area DA3 of a second side portion SS2 of the display panel 100 may be substantially the same as the second display area DA2 of the first side portion SS1 of FIG. 12, and thus, a detailed description thereof will be omitted for convenience of explanation.

Figure 13:
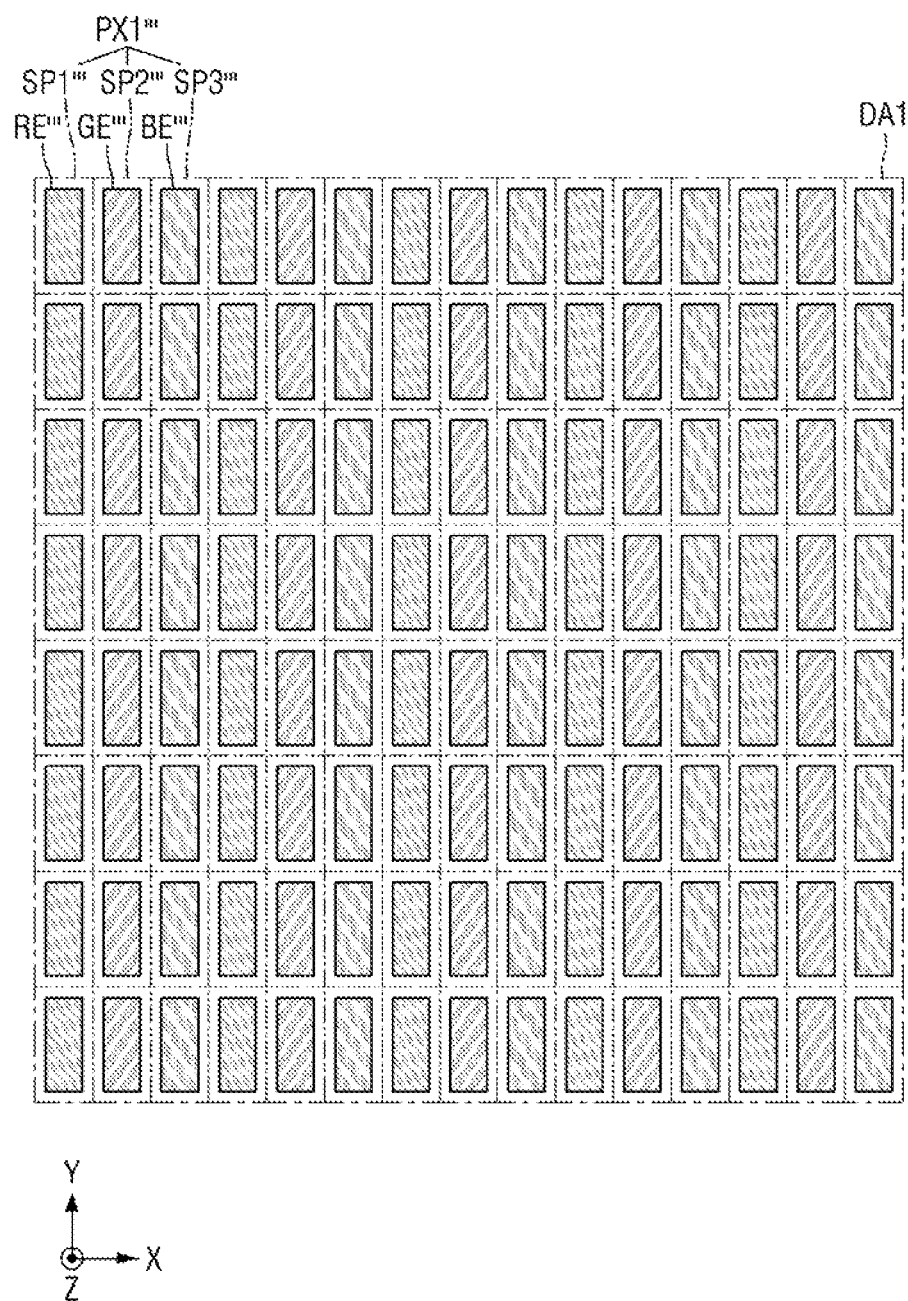
FIG. 13 is a layout view of a first display area of a front portion of a display panel according to another exemplary embodiment of the present inventive concepts.
Figure 14:
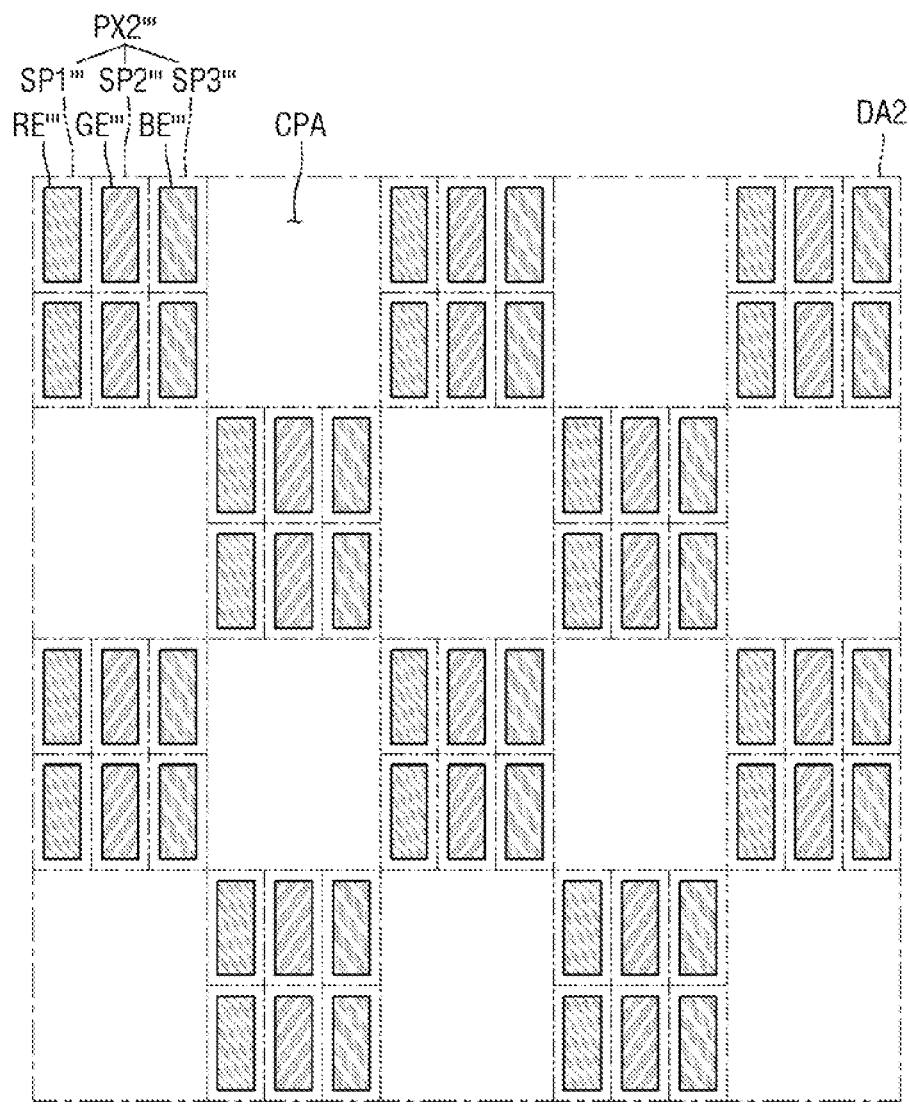
FIG. 14 is a layout view of a second display area of a first side portion of the display panel of FIG. 13 according to an exemplary embodiment of the present inventive concepts.

FIG. 13 is a layout view of a first display area DA1 of a front portion FS of a display panel 100 according to another exemplary embodiment of the present inventive concepts. FIG. 14 is a layout view of a second display area DA2 of a first side portion SS1 of the display panel 100 of FIG. 13.

The exemplary embodiments of FIGS. 13 and 14 differs from the exemplary embodiments of FIGS. 4 and 5 based on each of first pixels PX1''' includes three subpixels, such as the first, second, and third subpixels SP1''', SP2''', and SP3''', and each of second pixels PX2''' including three subpixels, such as the first, second, and third subpixels SP1''', SP2''', and SP3'''.

Referring to the exemplary embodiments of FIGS. 13 and 14, each of the first pixels PX1''' may include first, second, and third subpixels SP1''', SP2''', and SP3''' as compared to the first pixels PX1 of FIG. 4 which includes first to fourth subpixels SP1, SP2, SP3, SP4. The first, second, and third subpixels SP1''', SP2''', and SP3''' may be arranged in the X direction.

The first subpixel SP1''' may include a first emission area RE''' which emits light of a first color. The second subpixel SP2''' may include a second emission area GE''', which emits light of a second color. The third subpixel SP3" may include a third emission area BE', which emits light of a third color. The first, second, and third emission areas RE''', GE''', and BE''' may emit light of different colors.

As shown in the exemplary embodiment of FIGS. 13-14, the first emission areas RE''', second emission areas GE''', and third emission areas BE''' of the first pixel PX1''' and second pixel PX2''' may have a rectangular shape in a plan view (e.g., in a plane defined in the X and Y directions). However, exemplary embodiments of the present inventive concepts are not limited thereto. Alternatively, the first emission areas RE''', the second emission areas GE''', and the third emission areas BE''' may have a non-tetragonal polygonal shape, a circular shape, or an elliptical shape in a plan view. FIGS. 13 and 14 illustrate that the first emission areas RE''', the second emission areas GE''', and the third emission areas BE' have substantially the same size. However, exemplary embodiments of the present inventive concepts are not limited thereto.

A third display area DA3 of a second side portion SS2 of the display panel 100 may be substantially the same as the second display area DA2 of the first side portion SS1 of FIG. 14, and thus, a detailed description thereof will be omitted for convenience of explanation.

Figure 15:
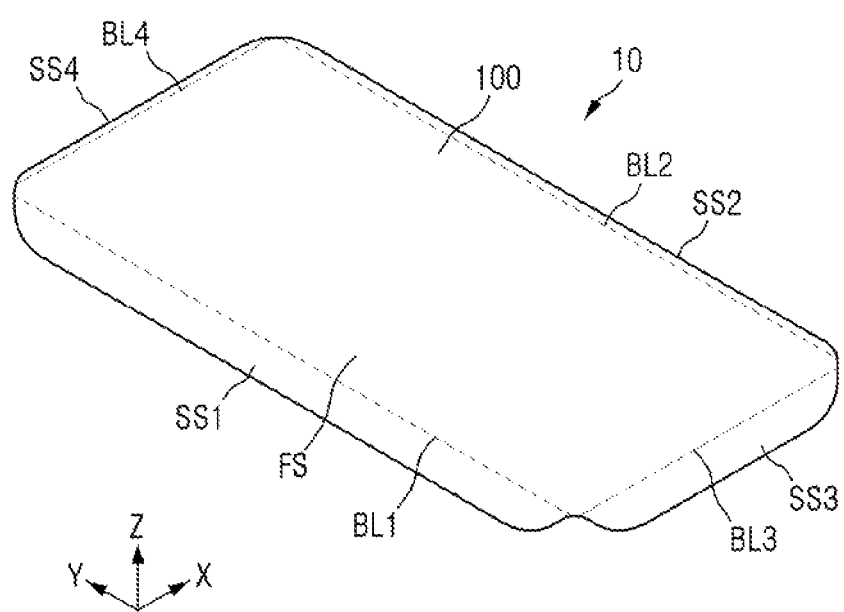
FIG. 15 is a perspective view of a display device according to another exemplary embodiment of the present inventive concepts.

FIG. 15 is a perspective view of a display device according to another exemplary embodiment of the present inventive concepts.

The exemplary embodiment of FIG. 15 differs from the exemplary embodiment of FIG. 1 based on a display panel 100 further includes third and fourth side portions SS3 and SS4. The embodiment of FIG. 15 will hereinafter be described, focusing mainly on the differences with the exemplary embodiment of FIG. 1.

Referring to the exemplary embodiment of FIG. 15, the third side portion SS3 may extend from a third side of a front portion FS. The third side may be a relatively shorter side of the display panel 100 that is a lower side thereof (e.g., in the Y direction). The third side portion SS3 may be bent along a third bending line BL3 on the third side of the front portion FS and may have a third curvature. The third side portion SS3 may have a similar structure as the first and second side portions SS1, SS2 shown in the exemplary embodiments of FIG. 1-14. While the exemplary embodiment of FIG. 15 shows the third side of the front portion FS as the lower side of the front portion FS (e.g., in the Y direction), exemplary embodiments of the present inventive concepts are not limited thereto.

The fourth side portion SS4 may extend from a fourth side of the front portion FS. The fourth side may be a relatively shorter side of the display panel 100 that is an upper side thereof (e.g., in the Y direction). The fourth side portion SS4 may be bent along a fourth bending line 1314 on the fourth side of the front portion FS and may have a fourth curvature. The fourth curvature may be substantially the same as, or different from, the third curvature. The fourth side portion SS4 may have a similar structure as the first and second side portions SS1, SS2 shown in the exemplary embodiments of FIGS. 1-14. While the exemplary embodiment of FIG. shows the fourth side of the front portion FS as the upper side of the front portion FS, exemplary embodiments of the present inventive concepts are not limited thereto.

Figure 16:
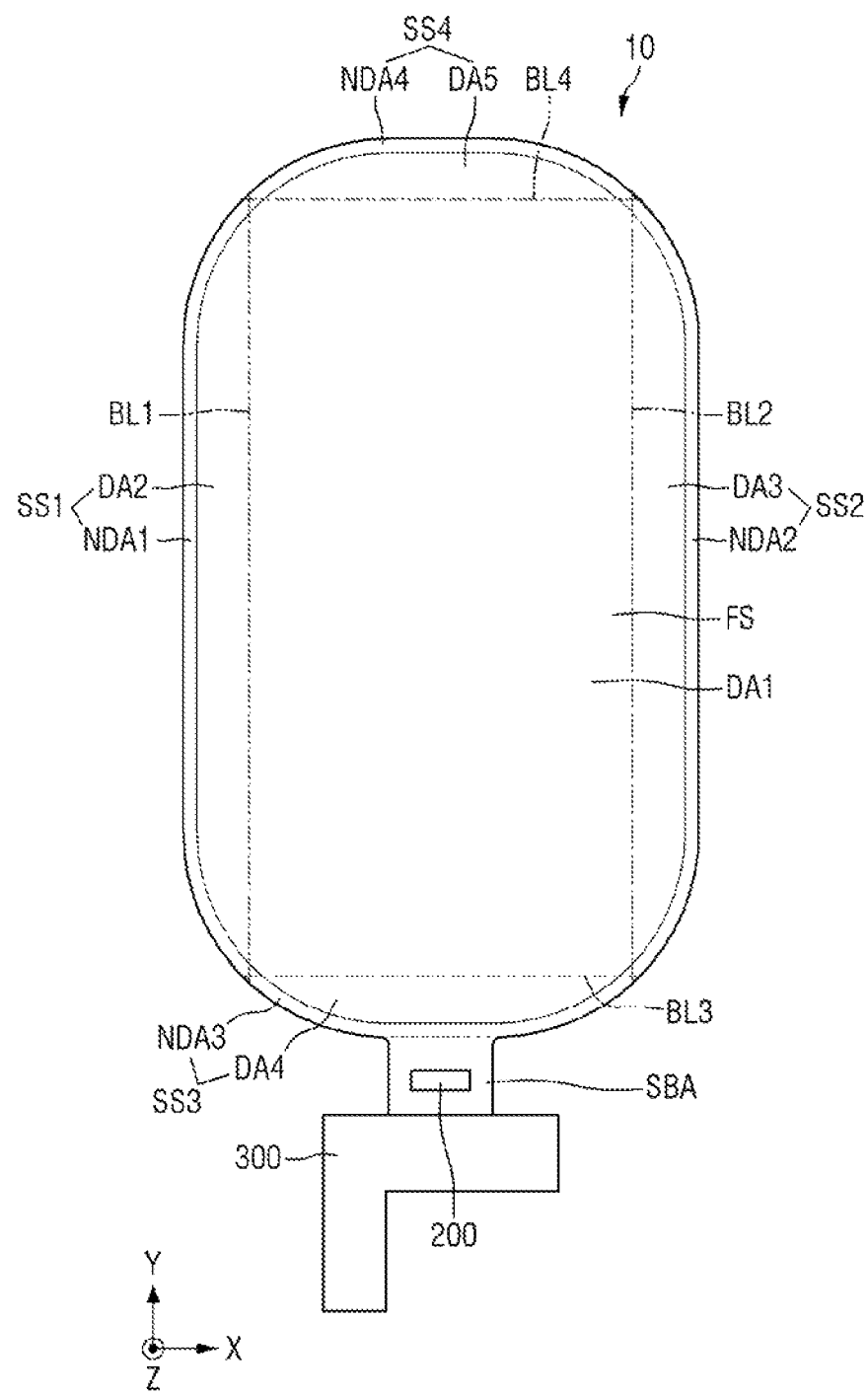
FIG. 16 is an exploded perspective view of a display device according to another exemplary embodiment of the present inventive concepts.

FIG. 16 is an exploded perspective view of a display device according to another exemplary embodiment of the present inventive concepts.

The exemplary embodiment of FIG. 16 differs from the exemplary embodiment of FIG. 3 based on the display panel 100 further including third and fourth side portions SS3 and SS4. The exemplary embodiment of FIG. 16 will hereinafter be described, focusing mainly on the differences with the exemplary embodiment of FIG. 3 and repeated description of substantially identical elements will be omitted for convenience of explanation.

Referring to the exemplary embodiment of FIG. 16, a front portion FS may include only a first display area DA1 For example, the front portion FS may not include a non-display area.

The third side portion SS3 may include a fourth display area DA4, which displays an image, and a third non-display area NDA3, which does not display an image. The fourth display area DA4 may be disposed on the lower side of the first display area DA1 (e.g., in the Y direction), and the third non-display area NDA4 may be disposed on the lower side of the fourth display area DA4. The third non-display area NDA3 may be disposed along the lower edge of the display panel 100.

The fourth side portion SS4 may include a fifth display area DA5, which displays an image, and a fourth non-display area NDA4, which does not display an image. The fifth display area DA5 may be disposed on the upper side of the first display area DA1 (e.g., in the Y direction), and the fourth non-display area NDA4 may be disposed on the upper side of the fifth display area DA5. The fourth non-display area NDA4 may be disposed along the upper edge of the display panel 100 (e.g., in the Y direction).

The first and fourth display areas DA1 and DA4 may be divided by a third bending line BL3. For example, the first display area DA1 may be an area disposed on the upper side of the third bending line BL3 (e.g., in the Y direction), and the fourth display area DA4 may be an area disposed on the lower side of the third bending line BL3 (e.g., in the Y direction).

The first and fifth display areas DA1 and DA5 may be divided by a fourth bending line BL4. For example, the first display area DA1 may be an area disposed on the lower side of the fourth bending line BL4 (e.g., in the Y direction), and the fifth display area DA5 may be an area disposed on the upper side of the fourth bending line BL4 (e.g., in the Y direction).

A sub-area SBA may be disposed on the lower side of the third non-display area NDA3. A display driving circuit 200 and a display circuit board 300 may be disposed in the sub-area SBA.

Referring to the exemplary embodiment of FIG. 16, since the front portion FS, a first side portion SS1, a second side portion SS2, the third side portion SS3, and the fourth side portion SS4 of the display panel 100 include the first display area DA1, a second display area DA2, a third display area DA3, the fourth display area DA4, and the fifth display area DA5, respectively, a user can view an image not only from the front portion FS, but also from the first, second, third, and fourth side portions SS1, SS2, SS3, and SS4, of the display panel 100. The exemplary embodiment of FIG. 15 may have similar features in which display areas are disposed in the front portion FS and each of the first to fourth side portions SS1-SS4.

The fourth and fifth display areas DA4 and DA5 of the third and fourth side portions SS3 and SS4, respectively, may be substantially the same as the second display area DA2 of the first side portion SS1 of any one of the exemplary embodiments of FIGS. 5, 9, 10, 11, 12, and 14, and thus, detailed descriptions thereof will be omitted for convenience of explanation.

Figure 17:
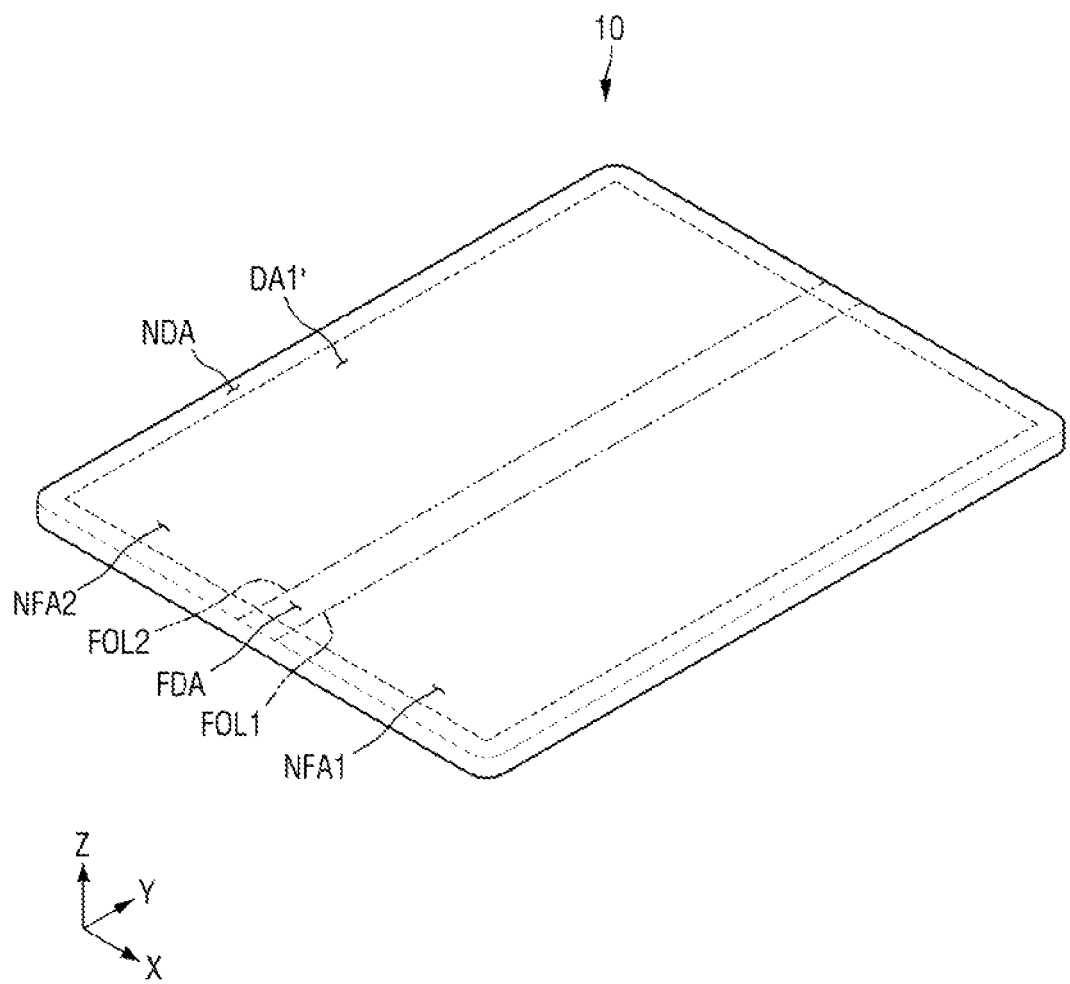
FIGS. 17 and 18 are perspective views of a display device according to other exemplary embodiment of the present inventive concepts.
Figure 18:
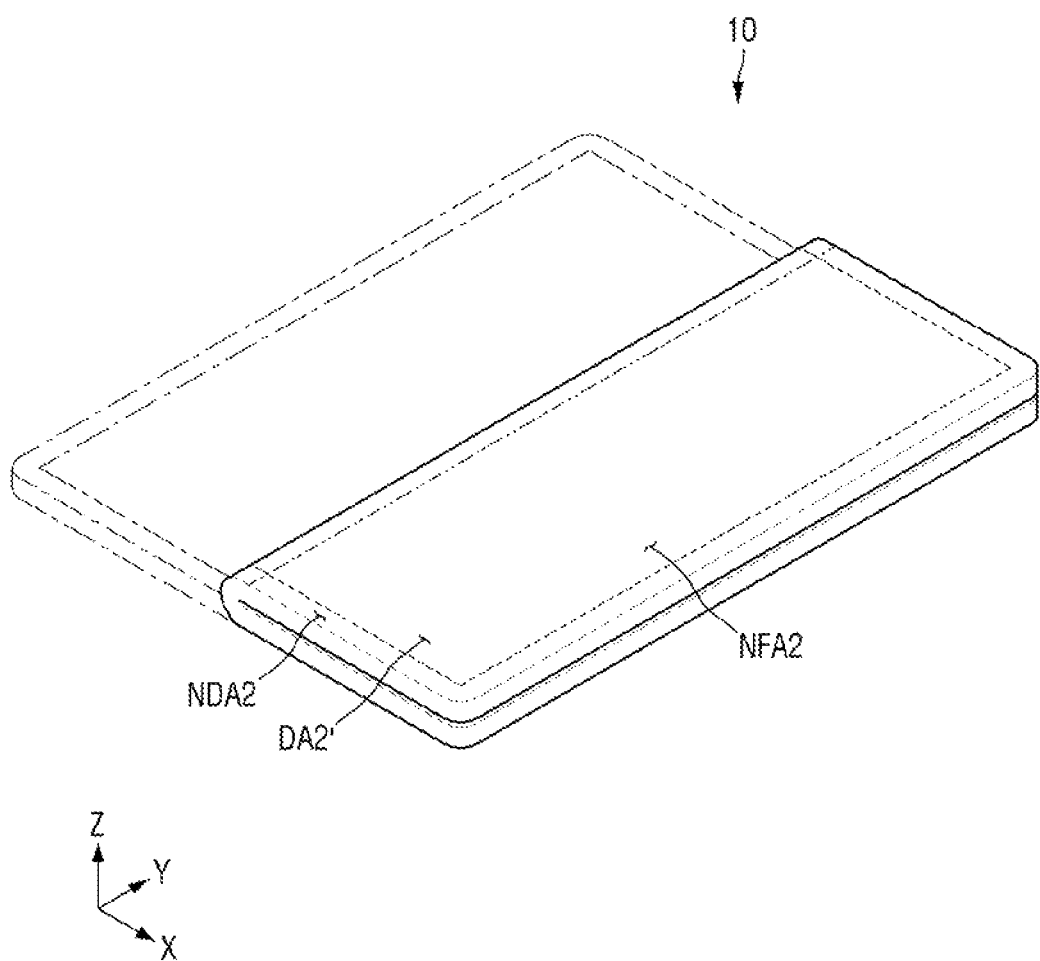

FIGS. 17 and 18 are perspective views of a display device according to another exemplary embodiment of the present inventive concepts.

FIGS. 17 and 18 illustrate that a display device 10 is a foldable display device that can be folded in the X direction.

Referring to the exemplary embodiments of FIGS. 17 and 18, the display device 10 may be able to maintain a folded state and an unfolded state. The display device 10 may be in-folded so that the front surface of the display device 10 may be disposed on the inside of the display device 10. In this exemplary embodiment, parts of the front surface of the display device 10 may be disposed to face each other. Alternatively, the display device 10 may be out-folded so that the front surface of the display device 10 may be disposed on the outside of the display device 10. In this exemplary embodiment, portions of the rear surface of the display device 10 may be disposed to face each other.

A first non-folding area NFA1 may be disposed on one side, for example, the right side, of a folding area FDA (e.g., in the X direction). A second non-folding area NFA2 may be disposed on the other side, for example, the left side, of the folding area FDA (e.g., in the X direction).

First and second folding lines FOL1 and FOL2 may extend in the Y direction, and the display device 10 may be folded in the X direction. As a result, since the length, in the X direction, of the display device 10 may be reduced by about half, the display device 10 may have increased portability since a user may easily carry the display device 10.

The direction in which the first and second folding lines FOL1 and FOL2 extend is not particularly limited to the Y direction. For example, in other exemplary embodiments, the first and second folding lines FOL1 and FOL2 may extend in the X direction, and the display device 10 may be folded in the Y direction. In this exemplary embodiment, the length, in the Y direction, of the display device 10 may be reduced by about half. Alternatively, the first and second folding lines FOL1 and FOL2 may extend in a diagonal direction of the display device 10, such as in a direction between the X direction and the Y direction. In this exemplary embodiment, the display device 10 may be folded into a triangular shape.

In an exemplary embodiment in which the first and second folding lines FOL1 and FOL2 extend in the Y direction, the length of the folding area FDA in the X direction may be smaller than the length of the folding area FDA in the Y direction. The length of the first non-folding area NFA1 in the X direction may be greater than the length of the folding area FDA in the X direction. The length of the second non-folding area NFA2 in the X direction may be greater than the length of the folding area FDA in the X direction.

A first display area DA1' may be disposed on the front surface of the display device 10. The first display area DA1' may overlap with the folding area FDA, the first non-folding area NFA1, and the second non-folding area NFA2. Therefore, when the display device 10 is unfolded, an image may be displayed in the folding area FDA, the first non-folding area NFA1, and the second non-folding area NF A2 of the display device 10 in a forward direction (e.g., facing the front surface of the display device 10).

A second display area DA2' may be disposed on the rear surface of the display device 10. The second display area DA2' may overlap with the second non-folding area NFA2. Therefore, when the display device 10 is folded, an image may be displayed in the second non-folding area NFA2 of the display device 10 in the forward direction (e.g., facing the front surface of the display device 10).

In an exemplary embodiment, the first display area DA1' of the folding area FDA of the exemplary embodiments of FIGS. 17 and 18 may be substantially the same as the second display area DA2 of the first side portion SS1 of any one of the exemplary embodiments of FIGS. 5, 9, 10, 11, 12, and 14, and thus, a detailed description thereof will be omitted.

Figure 19:
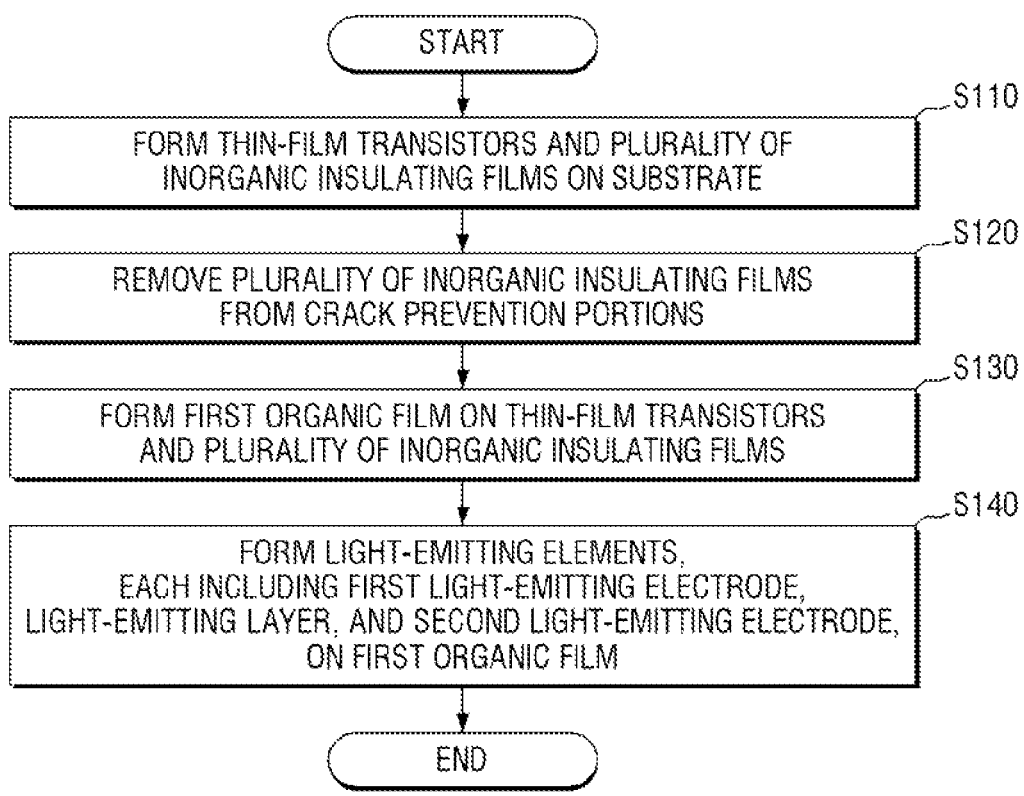
FIG. 19 is a flowchart illustrating a method of fabricating a display device according to an exemplary embodiment of the present inventive concepts.

FIG. 19 is a flowchart illustrating a method of fabricating a display device according to an exemplary embodiment of the present inventive concepts. FIGS. 20 through 23 are cross-sectional views illustrating the method of FIG. 19.

A method of fabricating a display device according to an exemplar embodiment of the present inventive concepts will hereinafter be described with reference to the exemplary embodiments of FIGS. 19 through 23.

Referring to FIG. 19, in block S110, TFTs and a plurality of inorganic insulating films are formed on a substrate.

Figure 20:
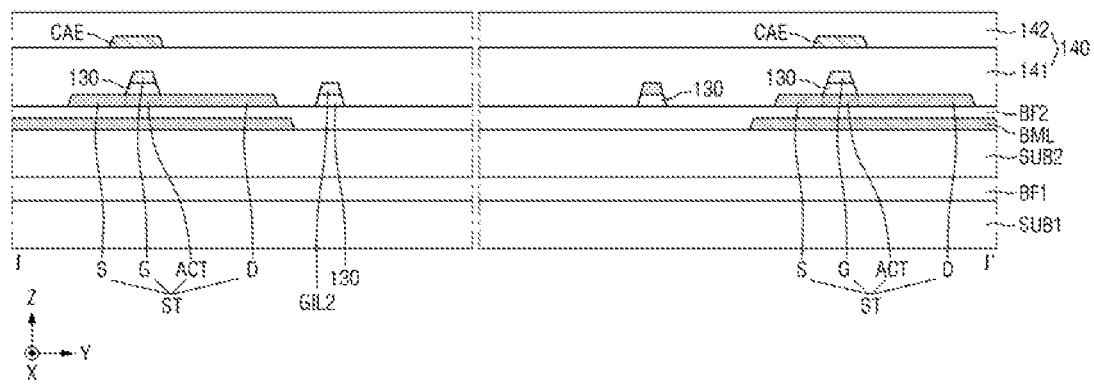
FIG. 20 through 23 are cross-sectional views illustrating the method of FIG. 19 according to exemplary embodiments of the present inventive concepts.

Referring to the exemplar embodiment of FIG. 20, a first substrate SUB1 is formed by depositing an organic material on a supporting substrate, a first buffer film BF1 is formed by depositing an inorganic material on the first substrate SUB1, and a second substrate SUB2 is formed by depositing an organic material on the first buffer film BF1. For example, the first and second substrates SUB1 and SUB2 may include polyimide. However, exemplary embodiments of the present inventive concepts are not limited thereto.

TFTs ST and a plurality of inorganic insulating films are formed on the second substrate SUB2. Each of the TFTs ST may include an active layer ACT, a source electrode S, a drain electrode D, and a gate electrode G. The plurality of inorganic insulating films may include a second buffer film BF2, a first interlayer insulating film 141, and a second interlayer insulating film 142. Referring to the exemplary embodiment of FIG. 20, the gate insulating film 130 may be a first insulating film, the first interlayer insulating film 141 may be a second insulating film, and the second interlayer insulating film 142 may be a third insulating film.

A light-blocking layer BM L is formed on the second substrate SUB2. In an exemplary embodiment, the light-blocking layer BML may be formed through photolithography. However, exemplary embodiments of the present inventive concepts are not limited thereto.

The second buffer film BF2 is formed by depositing an inorganic material on the light-blocking layer BML.

In an exemplary embodiment, the active layers ACT of the TFTs ST are formed on the second buffer film BF2 through photolithography.

The gate insulating film 130 is formed by depositing an inorganic material on the active layers ACT of the TFTs ST.

The gate electrodes (i of the TFTs ST and scan lines, such as the first and second scan lines SL1 and SL2 may be formed on the gate insulating film 130 through photolithography. FIG. 20 illustrates only a second scan initialization line GIL2 among the sub-scan lines of each of the first and second scan lines SL1 and SL2.

Since the gate insulating film 130 is etched using the gate electrodes G of the TFTs ST, the gate insulating film 130 may be disposed between the gate electrodes G and the active layers ACT of the TFTs ST and between the first and scan lines SL1 and SL2 and the second buffer film BF2. Also, since portions of the active layers ACT of the TFTs ST that are not covered (e.g., are exposed) by the gate insulating film 130 are doped with impurities or ions, the exposed parts of the active layers ACT may have conductivity. Accordingly, the source electrodes S and the drain electrodes D of the TFTs ST that have conductivity may be formed.

An interlayer insulating film 140 which includes a first interlayer insulating film 141 and a second interlayer insulating film 142 is formed by depositing an inorganic material on the gate electrodes G, the source electrodes S, and the drain electrodes 1) of the TFTs ST, the first and second scan lines SL1 and SL2, and the second buffer film BF2.

Capacitor electrodes CAE are formed on the first interlayer insulating film 141 through photolithography.

The second interlayer insulating film 142 is formed on the capacitor electrodes CAE and the first interlayer insulating film 141.

Thereafter, referring again to FIG. 19, in block S120 a hole of a crack prevention portion is formed by removing the plurality of inorganic insulating films.

Figure 21:
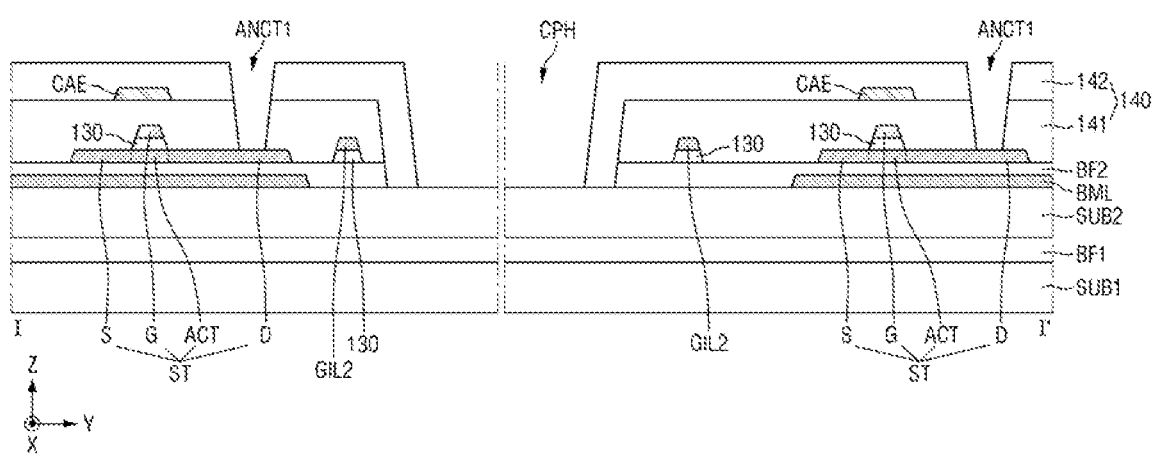

Referring to the exemplary embodiment of FIG. 21, a hole CPH of a crack prevention portion CPA, which exposes the second substrate SUB2, is formed by removing the second buffer film BF2, the first interlayer insulating film 141, and the second interlayer insulating film 142 through photolithography.

Also, first anode contact holes ANCT1, which expose the drain electrodes D of the TFTs ST, are formed by removing the first and second interlayer insulating films 141 and 142 during the formation of the hole CPH of the crack prevention portion CPA.

In an exemplary embodiment, the hole CPH of the crack prevention portion CPA and the first anode contact holes ANCT1 may be formed at the same time. Therefore, since an additional process of forming the hole CPH of the crack prevention portion CPA is not needed, the method of manufacturing the display device 10 may have an increased efficiency and reduced cost.

Thereafter, referring again to FIG. 19, in block S130 a first organic film is formed on the TFTs and the plurality of inorganic films.

Figure 22:
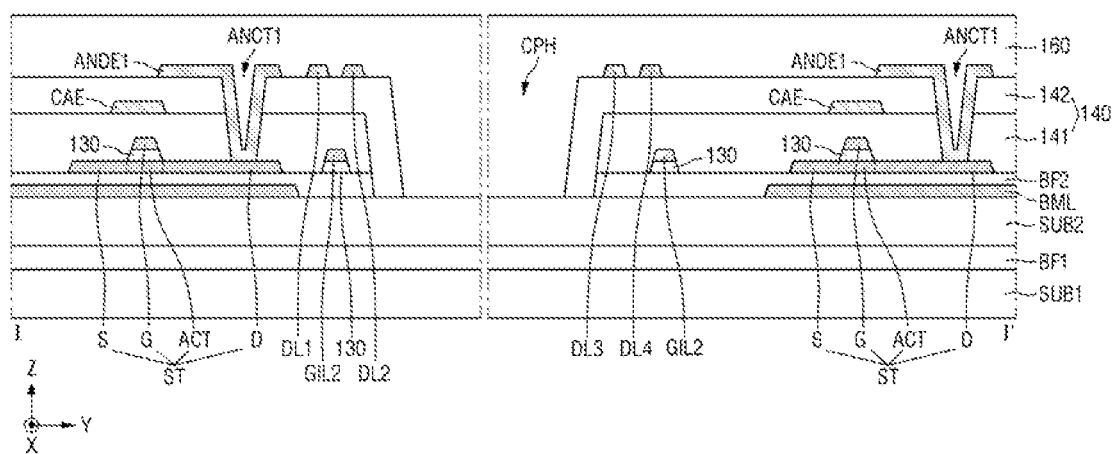

Referring to the exemplary embodiment of FIG. 22, first anode connecting electrodes ANDE1 and data lines, such as first to fourth data lines DL1, DL2, DL3, and DL4 are formed on the second interlayer insulating film 142. In an exemplary embodiment, the first anode connecting electrodes ANDE1 and the data lines may be formed through photolithography. The first anode connecting electrodes ANDE1 may be connected to the drain electrodes D of the TFTs ST through the first anode contact holes ANCT1.

A first organic film 160 is formed by depositing an organic material on the first anode connecting electrodes ANDE1 and the data lines, such as the first to fourth data lines DL1, DL2, DL3, and DL4 The hole CPH of the crack prevention portion CPA may be filled with the first organic film 160.

Thereafter, referring again to FIG. 19, in block S140 light-emitting elements, each including a first light-emitting electrode, a light-emitting layer, and a second light-emitting electrode, are formed on the first organic film.

Figure 23:
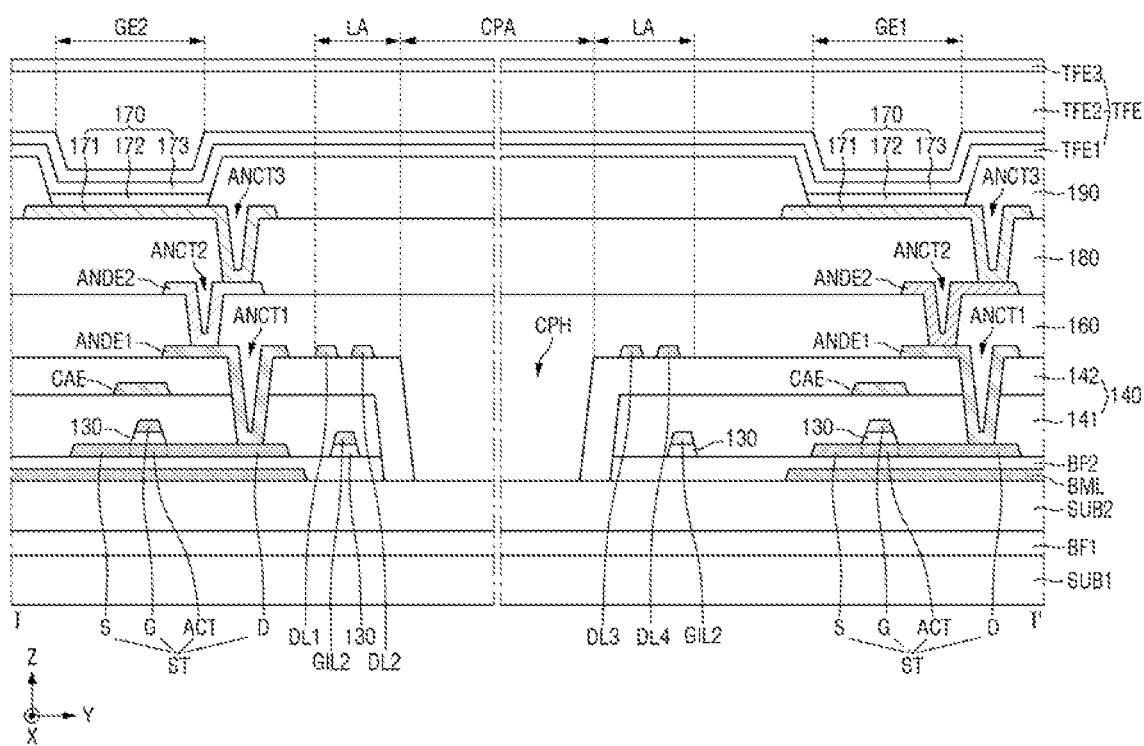

Referring to the exemplary embodiment of FIG. 23, second anode contact holes ANCT2, which expose the first anode connecting electrodes ANDE1 through the first organic film 160, are formed. In an exemplary embodiment, the second anode contact holes ANCT2 may be formed through photolithography.

Second anode connecting electrodes ANDE2 may be formed on the first organic film 160 through photolithography. The second anode connecting electrodes ANDE2 may be connected to the first anode connecting electrodes ANDE1 through the second anode contact holes ANCT2.

A second organic film 180 is formed by depositing an organic material on the first anode connecting electrodes ANDE1 and the first organic film 160.

Third anode contact holes ANCT3, which expose the second anode connecting electrodes ANDE2 through the second organic film 180 may be formed through photolithography.

First light-emitting electrodes 171 may be formed on the second organic film 180 through photolithography. The first light-emitting electrodes 171 may be connected to the second anode connecting electrodes ANDE2 through the third anode contact holes ANCT3.

A bank 190 may be formed on the second organic film 180 and the first light-emitting electrodes 171 through photolithography. The bank 190 may be formed to cover the third anode contact holes ANCT3 and edges of each of the first light-emitting electrodes 171.

Light-emitting layers 172 are formed on the first light-emitting electrodes 171, and a second light-emitting electrode 173 is formed by depositing a metallic material on the light-emitting layers 172 and the bank 190.

A first encapsulation film TFE1 is formed by depositing an inorganic material on the second light-emitting electrode 173, a second encapsulation film TFE2 is formed by depositing an organic material on the first encapsulation film TFE1, and a third encapsulation film TFE3 is formed by depositing an inorganic material on the second encapsulation film TFE2.

As illustrated in the exemplary embodiments of FIGS. 19 through 23, even if cracks are generated in at least one of the second buffer film BF2, the first interlayer insulating film 141, and the second interlayer insulating film 142, the propagation of the cracks may be prevented through the crack prevention portion CPA because the second buffer film BF2, the first interlayer insulating film 141, and the second interlayer insulating film 142 are not included (e.g., are removed) from the hole CPH of the crack prevention portion CPA.

In a display device and a method of fabricating the same according to an exemplary embodiment of the present inventive concepts, since the number of pixels per unit area of a display area of each side portion is reduced to be smaller than the number of pixels per unit area of a display area of a front portion, space in which to arrange crack prevention portions in each side portion may be secured. Since cracks are generated in inorganic films in each side portion, the propagation of the cracks may be prevented by the crack prevention portions.

In a display device and a method of fabricating the same according to an exemplary embodiment of the present inventive concepts, since a buffer film and an insulating film are removed from the crack prevention portions, the propagation of any cracks in at least one of the buffer film and the insulating film is prevented by the crack prevention portions.

In a display device and a method of fabricating the same according to an exemplary embodiment of the present inventive concepts, the size of the pixels in the display area of each side portion may be reduced to be smaller than the size of the pixels in the display area of the front portion. Accordingly, even if the number of pixels per unit area of each side portion is the same as the number of pixels per unit area of the front portion, the crack prevention portions may be arranged in each side portion. Therefore, the propagation of cracks in inorganic films may be prevented by the crack prevention portions without the need to secure additional space for the crack prevention portions.

While the present inventive concepts have been particularly shown and described with reference to the exemplary embodiments thereof, it will be understood by those of ordinary skill in the art that various changes in form and detail may be made thereto without departing from the spirit and scope of the present inventive concepts as set forth in the following claims.

What is claimed is:

1. A display device comprising:
a display panel comprising a substrate, the display panel including a front portion and at least one side portion that is bent from at least one side of the front portion, wherein
the front portion includes first pixels,
the at least one side portion includes second pixels and crack prevention portions that are disposed adjacent to the second pixels in a plan view in a first direction and a second direction crossing the first direction and expose an upper surface of the substrate, each of the crack prevention portions comprising a hole extending through a plurality of inorganic insulating films; and
a size of each of the first pixels is greater than a size of each of the second pixels.

2. The display device of claim 1, wherein a number of the first pixels per unit area disposed in the front portion is the same as a number of the second pixels per unit area disposed in the at least one side portion.

3. The display device of claim 1, wherein:
the first pixels and the second pixels each include first, second, third, and fourth emission areas; and
shapes of the first, second, third, and fourth emission areas of each of the first pixels are different from shapes of the first, second, third, and fourth emission areas of each of the second pixels.

4. The display device of claim 1, wherein:
the first pixels and the second pixels each include first, second, third, and fourth emission areas; and
sizes of the first, second, third, and fourth emission areas of each of the first pixels are different from sizes of the first, second, third, and fourth emission areas of each of the second pixels.

5. An electronic device comprising:
a display panel for displaying an image, and
wherein the display panel comprises a substrate, a front portion, and at least one side portion that is bent from at least one side of the front portion, and
wherein
the front portion includes first pixels,
the at least one side portion includes second pixels and crack prevention portions that are disposed adjacent to the second pixels in a plan view in a first direction and a second direction crossing the first direction and expose an upper surface of the substrate, each of the crack prevention portions comprising a hole extending through a plurality of inorganic insulating films; and
a size of each of the first pixels is greater than a size of each of the second pixels.

6. The electronic device of claim 5, wherein the display panel is applied to a display unit of a mobile phone, a smartphone, a tablet personal computer (PC), a mobile communication terminal, an electronic notepad, an electronic book (e-book), a portable multimedia player (PMP), a navigation device, an ultra-mobile PC (UMPC), a television (TV), a notebook computer, a monitor, a billboard, an Internet-of-Things (IoT) device, a smartwatch, a watchphone, a glasses display, a head-mounted display (HMD), or a dashboard, a center fascia, a center information display (CID), or a room mirror display of a vehicle.

* * * * *